United States Patent [19]

Narimatsu et al.

[11] 4,401,944
[45] Aug. 30, 1983

[54] DISPLACEMENT DETECTOR HAVING FIRST AND SECOND MAGNETORESISTIVE ELEMENTS WITH A BIAS FIELD AT 45° TO EACH ELEMENT

[75] Inventors: Akihisa Narimatsu, Naka; Hiroyuki Ohkubo, Chiba, both of Japan

[73] Assignee: Sony Corporation, Tokyo, Japan

[21] Appl. No.: 237,115

[22] Filed: Feb. 23, 1981

[30] Foreign Application Priority Data

Feb. 22, 1980 [JP] Japan ................................ 55-21112
Mar. 3, 1980 [JP] Japan ................................ 55-25268

[51] Int. Cl.³ .................. G01B 7/14; G01R 33/02; G01L 43/08
[52] U.S. Cl. .................................. 324/207; 324/252; 338/32 R
[58] Field of Search ............. 324/207, 208, 252, 173, 324/174; 338/32 R

[56] References Cited

U.S. PATENT DOCUMENTS

4,053,829 10/1977 Maruo ............................... 324/260

FOREIGN PATENT DOCUMENTS

1452392 10/1976 United Kingdom .
1492668 11/1977 United Kingdom .
1508892 4/1978 United Kingdom .
1545295 5/1979 United Kingdom .
2021843 12/1979 United Kingdom .
2052855 1/1981 United Kingdom .

*Primary Examiner*—Gerard R. Strecker
*Assistant Examiner*—Walter E. Snow
*Attorney, Agent, or Firm*—Lewis H. Eslinger; Alvin Sinderbrand

[57] ABSTRACT

The magnetic field sensing apparatus includes first and second magnetoresistive elements having respective angularly disposed current path portions through which a bias current flows and to which a bias magnetic field is supplied. An external magnetic signal field is supplied from a magnetic source, and the magnetoresistive elements are relatively displaceable with respect to this source. The bias field is supplied at an angle of approximately 45° with respect to the direction in which the bias current flows in each current path; and the source of external magnetic field generates a signal field whose polarity gradually decreases and then changes over to an opposite polarity at a boundary region. This change in the signal field is sensed by the magnetic sensor as it is relatively displaced, thereby producing an output signal that varies substantially linearly with this displacement over a predetermined range on both sides of the boundary region.

39 Claims, 43 Drawing Figures

FIG.21B    FIG.21A
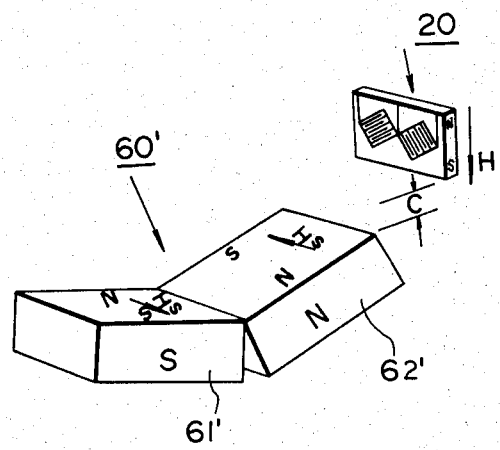
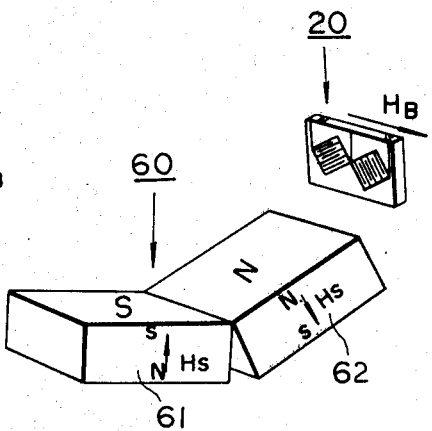
FIG.21C    FIG.21D
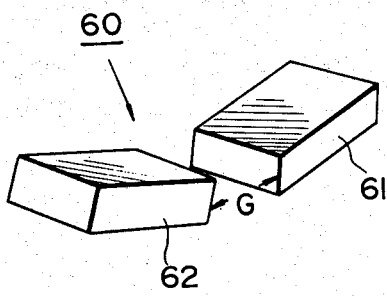
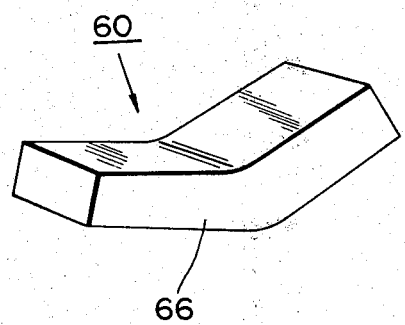

DISPLACEMENT DETECTOR HAVING FIRST AND SECOND MAGNETORESISTIVE ELEMENTS WITH A BIAS FIELD AT 45° TO EACH ELEMENT

BACKGROUND OF THE INVENTION

This invention relates to magnetic field sensing apparatus and, more particularly, to such apparatus which utilizes a magnetic sensor formed of magnetoresistive elements that is readily adapted to produce an output signal which is linearly related to the displacement of the sensor relative to a source of a magnetic signal field, whereby the sensor can be used in a servo control system, a position control system, and the like.

Many control systems, and particularly analog control systems such as servo control apparatus, employ magnetic sensing devices for use in sensing displacement of the controlled element, position of a controlled device, and the like. Such magnetic sensor devices generally have been used in place of conventional potentiometers for the purpose of producing and feeding back position-representing signals to, for example, a motor control system. In general, such magnetic sensing devices operate with relatively low power requirements, exhibit favorable longevity and are relatively simple to manufacture and assemble. Hence, such magnetic sensing devices find ready application in machine control systems, such as in driving a machine tool to a desired location, maintaining a driven element in a predetermined position in place of, for example, a mechanical brake, and the like.

One type of magnetic sensor that is used in control systems of the aforementioned type, and particularly, magnetic sensors which are used to control the rotational position of a rotary member such as a spindle, generally are used in conjunction with a magnetic element, such as a magnet or a magnetic material, that is secured to the periphery of the rotary member. The magnetic sensor then comprises a suitable pick-up device which is fixedly disposed adjacent the rotary path of this magnetic element. A typical magnetic pick-up device is adapted to sense a change in the magnetic flux coupled thereto due to the rotary presence of the magnetic element. The pick-up device may comprise a conventional magnetic head of the type which is provided with a magnetic core having a detecting coil wound thereabout so as to form a magnetic circuit, this magnetic circuit having a magnetic gap that is sensitive to changes in flux. Another type of magnetic pick-up device which has been used is a ferromagnetic magnetoresistive element which is provided with a ferromagnetic metal material whose resistivity varies as a function of the magnetic field applied thereto. One example of a suitable magnetoresistive element which employs this magnetoresistive effect is described in U.S. Pat. No. 3,928,836. Still another type of magnetic pick-up device which has been used is the semiconductor element which also exhibits a magnetoresistive effect, such as a Hall effect device.

Desirably, the magnetic pick-up device which is to be used in a control system, such as a servo control system, should be relatively sensitive to the displacement therefrom of the magnetic element. That is, the pick-up device should produce an output voltage which changes by relatively large increments in response to relatively small increments in changes of the relative displacement between the pick-up device and the magnetic element. Also, the magnetic pick-up device should exhibit a linear relationship between the output voltage derived therefrom and such displacement, this linearity being present over a relatively wide range of displacement.

Typical semiconductor magnetoresistive devices which have been used heretofore offer less than satisfactory characteristics. Typical of such semiconductor materials, such as gallium-arsenic, indium-antimony, and the like, are highly temperature dependent. Because of such temperature sensitivities, these semiconductor devices exhibit large and diverse variations in the resistivity thereof due to changes in temperature. Hence, when such semiconductor devices are used, a temperature compensation circuit must be coupled thereto in order to compensate for such temperature-dependent diversity in resistivity. Furthermore, in a typical magnetoresistive semiconductor device, the resistivity thereof varies approximately as the square of the magnetic field intensity, provided that the magnetic field is relatively small. These elements generally require a bias magnetic field on the order of about one kilogauss, or more. However, this bias magnetic field generally cannot be applied with sufficient uniformity over a large magnetic region. Thus, magnetoresitive semiconductor devices cannot exhibit the desirable linearity characteristics which are needed for the optimum operation and utilization of magnetic sensors.

Another difficulty in using magnetic sensors to detect the position of a rotary member relates to the magnetic element which must be provided on that member. In general, it is difficult to form the pole face of a metal magnet into an arcuate surface. Hence, bar-shaped magnetic elements typically are used, and these bar-shaped elements are secured to the peripheral surface of the rotary member. However, when such a bar-shaped magnetic element is secured to the rotary member, the center portion of the element generally is tangent to the cylindrical surface of the rotary member, but the opposite ends of the bar-shaped element are disposed at a greater radius from the axis of rotation of the rotary member than is the center portion of the bar-shaped element. Consequently, when the magnetic sensor is fixedly disposed adjacent the rotary path of the bar-shaped magnetic element, the opposite ends of that element rotate in a path that is closer to the device than the path of rotation of the center portion. Thus, the clearance, or spacing, between the magnetic sensor and the bar-shaped magnetic element is not constant. This condition affects the linearity of the output voltage derived from the magnetic sensor and also serves to limit the range over which the linear relationship, if any, obtains.

When using ferromagnetic metal in a magnetic sensor, the resistance thereof, that is, the magnetoresitive effect of the metal, changes as a function of the external magnetic field applied thereto. As explained by Mott's theory, the change in magnetoresistance is a negative change which appears as a linear reduction in the resistivity of the ferromagnetic element as the intensity of the applied magnetic field increases. An isotropic relationship with respect to the direction of the magnetic field obtains when the ferromagnetic material is heated to its Curie temperature. At lower temperatures, however, this isotropic relationship is minimal. In addition, in the presence of relatively small magnetic fields, the resistivity of the ferromagnetic material varies anisotropically with the direction of the applied magnetic field in temperature regions which are below the Curie temperature. For example, for a magnetoresistive element of the type described in the aforementioned patent, wherein a main current path is formed of ferromagnetic material, when the direction of the applied magnetic field is parallel to the path of the current flowing through the material, a maximum resistivity is exhibited. When the applied magnetic field is perpendicular to the direction in which the current flows, this resistivity is a minimum.

This anisotropic relationship is expressed in the Voight-Thomson equation:

$$R(\theta) = R_\perp \cdot \sin^2\theta + R_\parallel \cdot \cos^2\theta \tag{1}$$

wherein $\theta$ is the angle between the direction in which the current flows and the direction of the applied (preferably saturating) magnetic field, $R_\perp$ represents the resistivity of the material when the current flow direction and the direction of the applied magnetic field are perpendicular to each other, and $R_\parallel$ represents the resistivity of the material when the current flow direction and the direction in which the magnetic field is applied are parallel to each other. This anisotropic characteristic of ferromagnetic materials has been turned to account in various applications, such as those described in U.S. Pat. Nos. 4,021,728, 4,053,829 and 4,079,360. This characteristic also is used in copending application Ser. No. 23,270, filed Mar. 23, 1979 now U.S. Pat. No. 4,296,377.

Some examples of ferromagnetic metals which exhibit desirable magnetoresistive characteristics are nickel-cobalt (NiCo) alloy, nickel-iron (NiFe) alloy, nickel-aluminum (NiAl) alloy, nickel-manganese (Ni-Mn) alloy and nickel-zinc (NiZn) alloy. In magnetic sensors using magnetoresistive elements of the type described in the aforementioned patents, the external magnetic field which is supplied to the sensor typically is generated by a pair of abutting magnets that produce magnetic fields of opposite polarities. As these magnets are disposed relative to the magnetoresistive sensor, the magnetic field applied to that sensor abruptly changes over from one polarity to the other at the boundary line between the magnets. This abrupt change-over, or inversion, in the magnetic field limits the range over which the output signal produced by the magnetoresistive sensor is linearly related to the displacement of that sensor from the boundary line. Consequently, if a desired, or target position of the magnets relative to the sensor is taken as this boundary line, the control system with which the sensor is used should exhibit a desirably high response time.

OBJECTS OF THE INVENTION

Therefore, it is an object of the present invention to provide magnetic field sensing apparatus of the type which uses magnetoresistive elements, wherein the range over which the output signal derived from those elements is linearly related to the displacement between those elements and a source of external magnetic field is desirably large.

Another object of this invention is to provide magnetic field sensing apparatus of the type which uses magnetoresistive elements, wherein the output signal derived from the magnetoresistive elements in response to an external magnetic field applied thereto exhibits good linearity over a wide range of displacement between the elements and the source of the external field.

A further object of this invention is to provide improved magnetic field sensing apparatus which is readily adapted for use in a control system, such as an analog servo control system.

An additional object of this invention is to provide improved magnetic field sensing apparatus of the type which uses magnetoresistive elements, wherein the operating range over which an external magnetic field is detected is increased.

Yet another object of this invention is to provide magnetic field sensing apparatus which is particularly adapted to detect the rotational position of a rotary member over a relatively wide angular region.

A still further object of this invention is to provide improved magnetic field sensing apparatus which is operable with a source of external magnetic field, wherein the source is of particular configuration so as to improve the linearity and detection range of the apparatus.

Various other objects, advantages and features of the present invention will become readily apparent from the ensuing detailed description, and the novel features will be particularly pointed out in the appended claims.

SUMMARY OF THE INVENTION

In accordance with this invention, magnetic field sensing apparatus is provided with a magnetic sensor and a source of external magnetic field. The magnetic sensor includes first and second magnetoresistive elements having respective, substantially planar, current path portions disposed at a predetermined angle with respect to each other and through which current flows in correspondingly respective current flow directions. The magnetic sensor is coupled to a suitable source of bias current and is disposed in a bias magnetic field which lies in the plane of the respective current path portions. For example, the magnetic sensor may be mechanically coupled to a bias magnet. The source of external magnetic field supplies a magnetic signal field in the plane of the current path portions; and this source and the magnetic sensor are relatively displaceable with respect to each other. The magnetic signal field has a first polarity that gradually decreases and then changes over at a boundary region to an opposite polarity that thereafter gradually increases, all in the direction of relative displacement. The magnetic sensor detects this gradually changing magnetic signal field to produce an output signal that varies substantially linearly with the relative displacement over a predetermined range of displacement on both sides of the boundary region.

BRIEF DESCRIPTION OF THE DRAWINGS

The following detailed description, given by way of example, will best be understood in conjunction with the accompanying drawings in which:

FIGS. 21A–21D are schematic, perspective illustrations of variations in the structure which is used to generate the external magnetic field in the embodiment of FIG. 20;

FIGS. 29, 30 and 31A–31B are schematic, perspective illustrations of various embodiments of the present invention by which the characteristic curves shown in FIG. 28 are obtained;

DETAILED DESCRIPTION OF CERTAIN PREFERRED EMBODIMENTS

Figure 1:
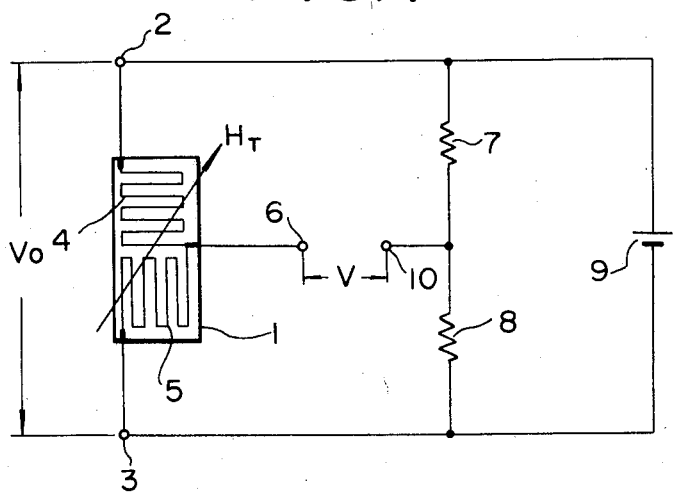
FIG. 1 is a schematic diagram of a basic embodiment of a magnetic sensor that is used with the present invention.

Referring now to the drawings, wherein like reference numerals are used throughout, FIG. 1 illustrates a basic circuit arrangement by which a magnetic sensor, comprised of a magnetoresistive device 1, produces an output voltage V which is a function of the magnetic field $H_T$ detected thereby. In particular, magnetoresistive device 1 is comprised of a pair of strips 4 and 5 formed of a ferromagnetic material having the magnetoresistive effect. The longitudinal direction of strip 4 is perpendicular to that of strip 5. Strips 4 and 5 are connected electrically to each other in series. Current supply terminals 2 and 3 are connected to the opposed ends of strips 4 and 5; and an output terminal 6 is connected to the junction defined by the series connection of these strips. The ferromagnetic material of which strips 4 and 5 are formed may be nickel-cobalt (NiCo) alloy, nickel-ferrite (NiFe) alloy, nickel-aluminum (NiAl) alloy, nickel-manganese (NiMn) alloy or nickel-zinc (NiZn) alloy. It is seen that each strip is arranged in serpentine configuration, and each strip includes a main current conducting portion and an associated connecting portion. Strips 4 and 5 thus are seen to be respective magnetoresistive elements which are described in greater detail in the aforementioned patents.

Typically, magnetoresistive device 1 is provided with an insulating substrate upon which strips 4 and 5 are deposited, as by a conventional vacuum evaporation technique, for example, to a depth of approximately 600 to 1,000 Å. The strips are deposited as a thin film which then is etched to form the serpentine configuration illustrated in FIG. 1. The main current conducting portions, or paths, of these magnetoresistive elements are perpendicular to each other.

Series-connected strips 4 and 5 are connected in parallel with resistors 7 and 8, these latter resistors being connected in series with each other, and the series connection of resistors 7 and 8 defines an output terminal 10. A suitable source of operating potential 9, such as a source of DC voltage, supplies a bias voltage $V_o$ across the parallel arrangement of series-connected strips 4,5 and series-connected resistors 7,8. Voltage source 9 thus supplies a bias current which flows through the perpendicularly disposed current path portions of strips 4 and 5.

In operation, it is appreciated, from equation (1) above, that magnetoresistive device 1 exhibits resistive characteristics in response to a magnetic field $H_T$ supplied thereto. It it is assumed that this magnetic field $H_T$ is of sufficient strength to saturate the magnetoresistive device, for example, if the magnetic field is on the order of about 100 $O_e$, then, if this magnetic field $H_T$ rotates, the output voltage V produced across output terminals 6 and 10 varies as a function of the angle $\theta$ which is formed between the magnetic field $H_T$ and the current flow direction in the current path portion of strip 4 (or the current flow direction of the current path portion in strip 5) in accordance with the following equation:

$$V = KV_o \cos 2\theta \qquad (2)$$

The factor K is a proportionality constant which is determined by the particular ferromagnetic material that is used. As described in the aforementioned patents, this factor K is a function of the resistances exhibited by magnetoresistive elements 4 and 5 in response to magnetic field $H_T$ and, more particularly, such resistances are a function of the resistance attributed to the magnetic field component which is perpendicular to the current path portion plus the resistance which is attributed to the magnetic field component that is parallel to the current path portion.

Figure 2:
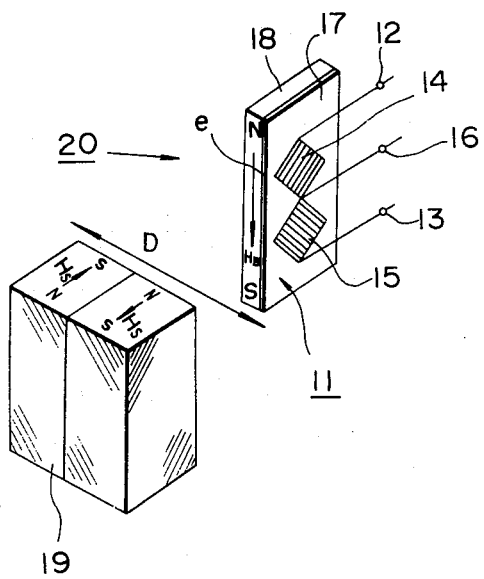
FIG. 2 is a schematic, perspective illustration of the relative displacement between the magnetic sensor and a source of external magnetic field.

Referring now to FIG. 2, there is illustrated a typical application of magnetoresistive device 1 used as a magnetic sensor to sense the magnetic field generated by a source thereof, referred to herein as a signal magnet. The signal magnet, identified by reference numeral 19 in FIG. 2, generates an external magnetic field, known as a signal field $H_S$. It is appreciated that this signal field $H_S$ is applied to, and is received by the magnetoresistive device in a particular direction. This direction varies if the source magnet and the magnetoresistive device are displaceable relative to each other.

In FIG. 2, magnetoresistive device 11 includes planar current path portions 14 and 15, these current path portions being analogous to aforedescribed ferromagnetic strips 4 and 5 (FIG. 1). Current path portions 14 and 15 are connected in series, and these respective current path portions are disposed perpendicularly with respect to each other. An output terminal 16 is coupled to the junction defined by the series-connected current path portions; and input terminals 12 and 13 are provided for a bias current to flow in these series-connected current path portions. The magnetoresistive elements which constitute current path portions 14 and 15 are deposited on substrate 17 which, in turn, is mounted on a bias magnet 18. The bias magnet supplies a bias magnetic field $H_B$, in the illustrated direction, in the plane of magnetoresistive elements 14 and 15. It is appreciated that bias field $H_B$ is supplied at an angle of approximately 45° with respect to the current path portion of magnetoresistive element 14, and also at an angle of approximately 45° with respect to the current path portion of magnetoresistive element 15. That is, the bias field $H_B$ is disposed at a 45° angle with respect to the bias current which passes through the magnetoresistive device.

Source magnet 19 is provided with two signal field generators. These signal field generators may be formed of suitable magnetizing material, and each is adapted to generate the magnetic signal field $H_S$ of opposite polarity. These polarities are illustrated in FIG. 2, and each signal field is seen to be perpendicular to the direction of the bias field $H_B$, and parallel to the surface of the magnetoresistive elements. For convenience, signal field $H_S$ generated by the right-most source magnet is assumed to exhibit positive polarity; and the signal field $H_S$ generated by the left-most source magnet is assumed to exhibit negative polarity.

Let it be assumed that the intensity of the bias field $H_B$ is equal to the intensity of the signal field $H_S$, such that $$|H_B| = |H_S|$$

The intensity of the composite magnetic field $H_T$ that is supplied to each of the magnetoresistive elements is seen to be equal to the vector summation of the bias and signal fields. This composite field $H_T$ produced in response to the bias field and the signal field generated by the right-most source magnet is seen to be parallel to the current path direction of magnetoresistive element 14 and, thus, is perpendicular to the current path direction of magnetoresistive element 15. It is assumed that this composite field $H_T$ is disposed at an angle $\theta = 90°$. That is, the composite field $H_T$ attributed to the signal field generated by the right-most source magnet is at an angle $\theta = 90°$ with respect to the current path direction of magnetoresistive element 15. Likewise, the composite field $H_T$ applied to the magnetoresistive elements in response to the signal field $H_S$ generated by the left-most source magnet is equal to the vector sum of this signal field and bias field $H_B$. That is, this composite field $H_T$ is seen to be perpendicular to the current path direction of magnetoresistive element 14 and, consequently, is parallel to the current path direction of magnetoresistive element 15. This composite field $H_T$ is applied at an angle $\theta = 0°$ with respect to the current path direction of magnetoresistive element 15.

Figure 3:
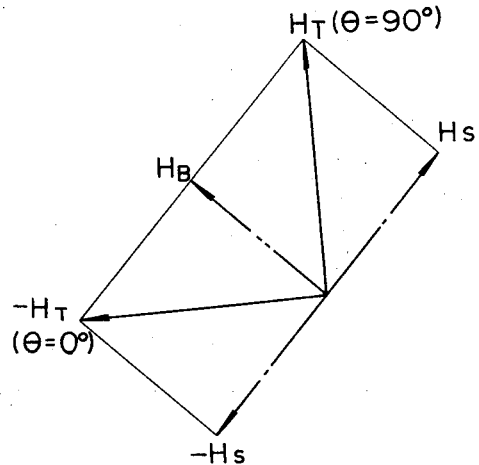
FIG. 3 is a vector diagram which is useful in explaining the operation of the arrangement shown in FIG. 2.

Assuming, as before, that the intensities of the bias and signal fields are equal, FIG. 3 illustrates the vector diagram of the composite field $H_T$, produced in response to the signal field $+H_S$ generated by the right-most source magnet; and the vector diagram of the composite field $-H_T$ produced in response to the signal field $-H_S$ produced by the left-most source magnet. The composite field $H_T$ thus may be expressed as:

$$|H_T| = \sqrt{|H_S|^2 + |H_B|^2} \qquad (3)$$

$$= \sqrt{2} \cdot H_S$$

$$= \sqrt{2} \cdot H_B$$

From equation (2) above, it is appreciated that a positive output voltage $+V$ is produced when the composite field $H_T$ is supplied at an angle $\theta = 0°$ to magnetoresistive device 11. Likewise, a negative output voltage $-V$ is produced in response to the composite field $H_T$ which is supplied at the angle $\theta = 90°$. If the intensity of the signal field $H_S$ is equal to zero, it is seen, from FIG. 3, that the composite field $H_T$ is supplied at an angle $\theta = 45°$. From equation (2) it is recognized that the output voltage V is equal to zero when $\theta = 45°$.

If magnetoresistive device 11 and source magnet 19 are relatively displaceable in the direction indicated by arrow D, the signal field $H_S$ that is supplied to the magnetoresistive device when that device is aligned with the boundary line between the left-most and right-most source magnets has an intensity equal to zero. This is because the positive and negative signal fields tend to cancel each other at this boundary line. If magnetoresistive device 11 is displaced from this boundary line in the rightward direction, the positive signal field $H_S$ supplied thereto increases in intensity, resulting in a corresponding increase in the positive output voltage $+V$ produced at output terminal 16. Conversely, if magnetoresistive device 11 is displaced from the boundary line in the leftward direction, the intensity of the negative signal field $-H_S$ supplied thereto increases, resulting in a corresponding increase in the negative output voltage $-V$. The relationship between this relative displacement between magnetoresistive device 11 and source magnet 19, and the output voltage V derived from output terminal 16 is graphically represented in FIG. 4. This output voltage is produced as a result of the angle $\theta$ at which the composite field $H_T$ is supplied to the magnetoresistive elements. Likewise, this angle is a function of the displacement of magnetoresistive device 11 from the boundary line of source magnet 19. From FIG. 4, it is appreciated that, when the polarity of the signal field $H_S$ changes over, the polarity of the output voltage V likewise changes over. Furthermore, it is seen that magnetoresistive device 11 does not suffer from deleterious hysteresis effects. When the magnetoresistive device is juxtaposed the boundary line of source magnet 19, the intensity of the signal field $H_S$ supplied to the magnetoresistive device is reduced effectively to zero, resulting in the composite field $H_T$ being supplied at the angle $\theta = 45°$. From equation (2) the output voltage V equals zero. If this boundary line is designated the "zero point", it is seen that V=0 when the magnetoresistive device is aligned with this zero point irrespective of a change in temperature because, even though the proportionality constant K may vary as a function of temperature, $\cos 2\theta = 0$ independent of temperature changes.

Figure 4:
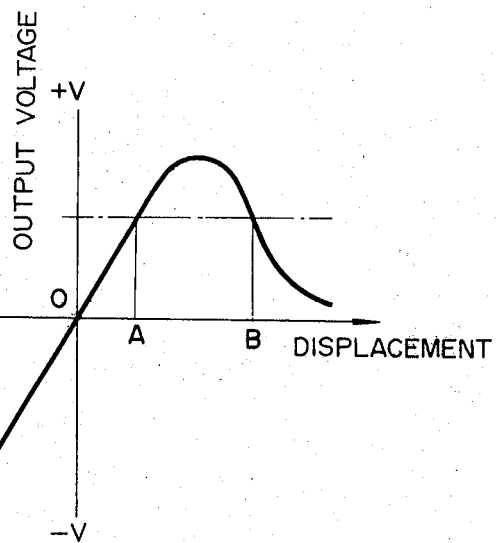
FIG. 4 is a graphical representation of the characteristic curve illustrating the relationship between the output voltage produced by the magnetic sensor and the relative displacement between that sensor and the source of external field.

The foregoing characteristics of magnetic sensor 20 are turned to account in control system applications, such as in position-detection or displacement-detection in a servo control system. That is, magnetic sensor 20 may be used in place of potentiometers which heretofore had been employed for detecting position or displacement. In particular, and as represented in FIG. 4, a linear relationship exists between the output voltage V, derived from magnetic sensor 20, and the relative displacement between magnetoresistive device 11 and source magnet 19. This linear relationship is particularly adapted for detecting displacement of the source magnet from a zero, or target position, as when the source magnet is mounted on a rotary member, such as a motor-controlled shaft, and then using the detected displacement to restore the rotary member to its target position. That is, magnetic sensor 20 may be used in place of a mechanical brake to maintain a rotary, or a movable, member in fixed position. However, the range over which the output voltage V is linearly related to the detected displacement is relatively limited. Furthermore, the range over which displacement can be detected accurately likewise is limited. For example, if the output voltage produced by magnetoresistive device 11 in FIG. 2 is at the level indicated by the broken line in FIG. 4, it is uncertain whether this voltage represents a displacement A or a displacement B. If, in fact, the output voltage represents displacement B, the servo system generally will be controlled to reduce this output voltage to its zero level, thus driving the movable member on which source magnet 19 is mounted in a direction to increase the displacement.

Another disadvantage of the characteristic represented by the curve shown in FIG. 4 is that the linear region of the voltage-displacement relationship is relatively narrow.

Figure 5:
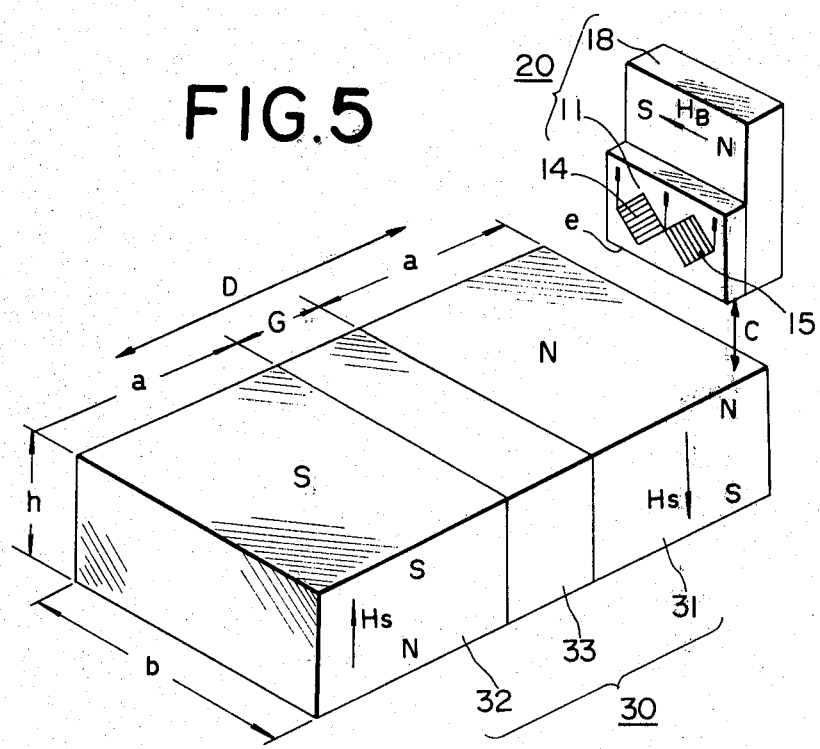
FIG. 5 is a schematic, perspective illustration of one embodiment of the present invention.

The foregoing disadvantages are avoided, in accordance with the present invention, wherein the sensitivity of the magnetic sensor to displacement is improved, the range over which the output voltage is linearly related to displacement is enlarged, and the output voltage varies uniformly with respect to displacement over a wide range. One embodiment of the present invention is illustrated in FIG. 5. In this embodiment, magnetic sensor 20 is similar to the magnetic sensor described hereinabove with respect to FIG. 2 in that it is comprised of magnetoresistive device 11, formed of perpendicularly-disposed magnetoresistive elements 14 and 15, this magnetoresistive device 11 being mounted on, or otherwise secured to, bias magnet 18. This bias magnet supplies the bias field $H_B$ in the plane of the magnetoresistive elements and in the illustrated horizontal direction. However, the source magnet is illustrated herein as signal field generator 30 comprised of magnets 31 and 32 spaced apart by non-magnetic material 33. It may be appreciated that magnets 31 and 32 may be suitable magnetizing elements capable of generating positive and negative signal fields $H_S$, as illustrated.

Magnet 31 is provided with a north (N) pole face to generate the positive signal field $H_S$, and magnet 32 is provided with a south (S) pole face to generate the negative signal field $-H_S$. Magnetic sensor 20 is spaced from the top surface of signal field generator 30 so as to exhibit a clearance C therefrom. The magnetic sensor and signal field generator are relatively displaceable in the direction indicated by the arrow D.

Section 33 of non-magnetic material interposed between magnets 31 and 32 defines a gap G between these magnets. It is appreciated that, if magnetic sensor 20 traverses a path in the direction of displacement D, the intensity of the positive signal field $H_S$ supplied thereto as it approaches gap G gradually decreases, and this polarity then changes over to the signal field $-H_S$ of gradually increasing intensity as the magnetic sensor continues past gap G. Because of this gap G of non-magnetic material 33, the rate at which the signal field $H_S$ changes over from positive to negative polarity is reduced relative to the rate at which the signal field polarity changes over in the arrangement shown in FIG. 2. As a result of this gradual changeover in the signal field, magnetic sensor 20 produces the output voltage V that is linearly related to the displacement between the magnetic sensor and gap G, and whose polarity gradually changes over when the magnetic sensor crosses the central portion of this gap. More particularly, the range over which this output voltage varies linearly with displacement is enlarged with respect to the linear range of the arrangement in FIG. 2. Thus, the output voltage V varies uniformly with the displacement of magnetic sensor 20 relative to signal field generator 30.

Figure 6:
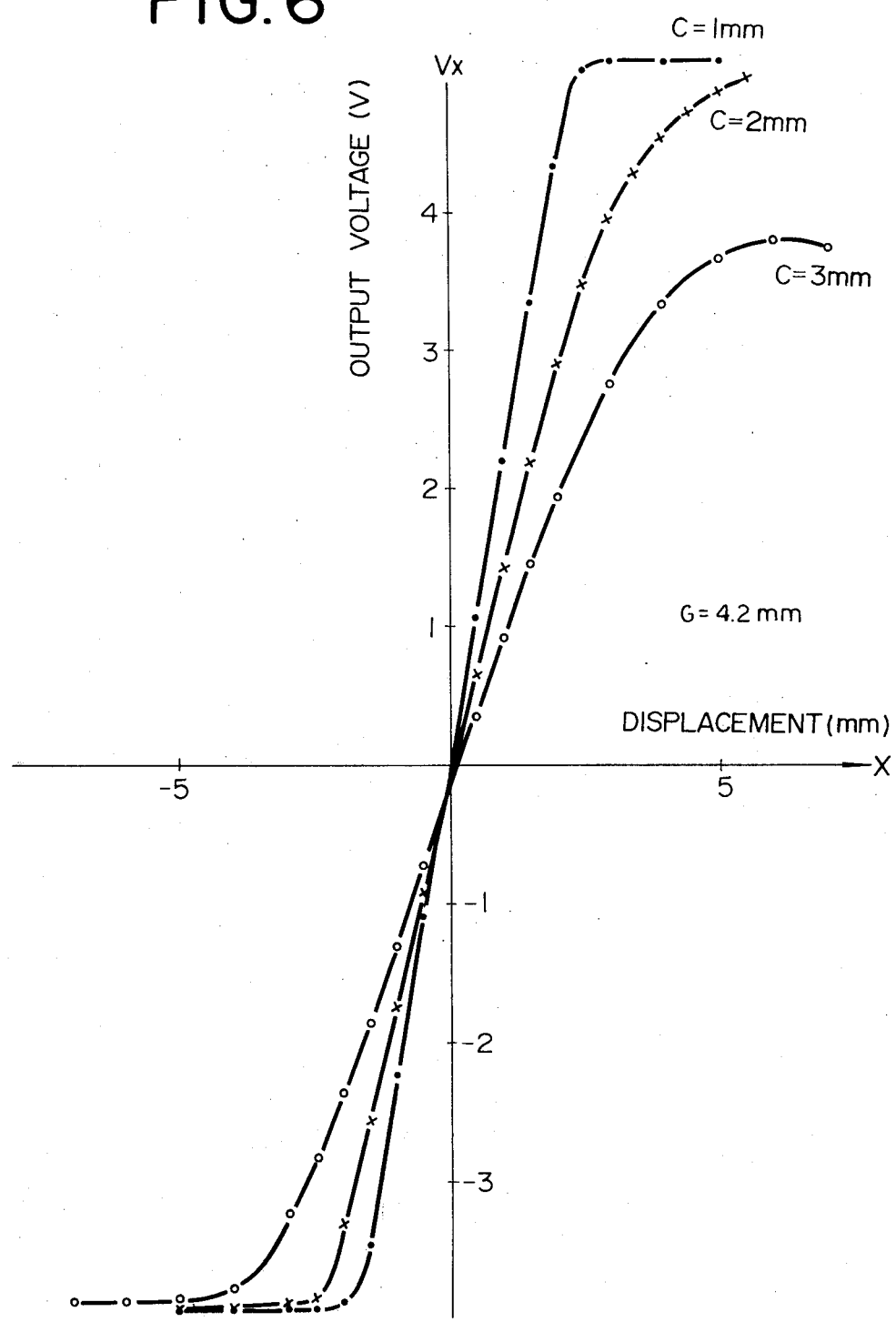
FIGS. 6–8 are graphical representations of characteristic curves which are obtained from the embodiment shown in FIG. 5.
Figure 7:
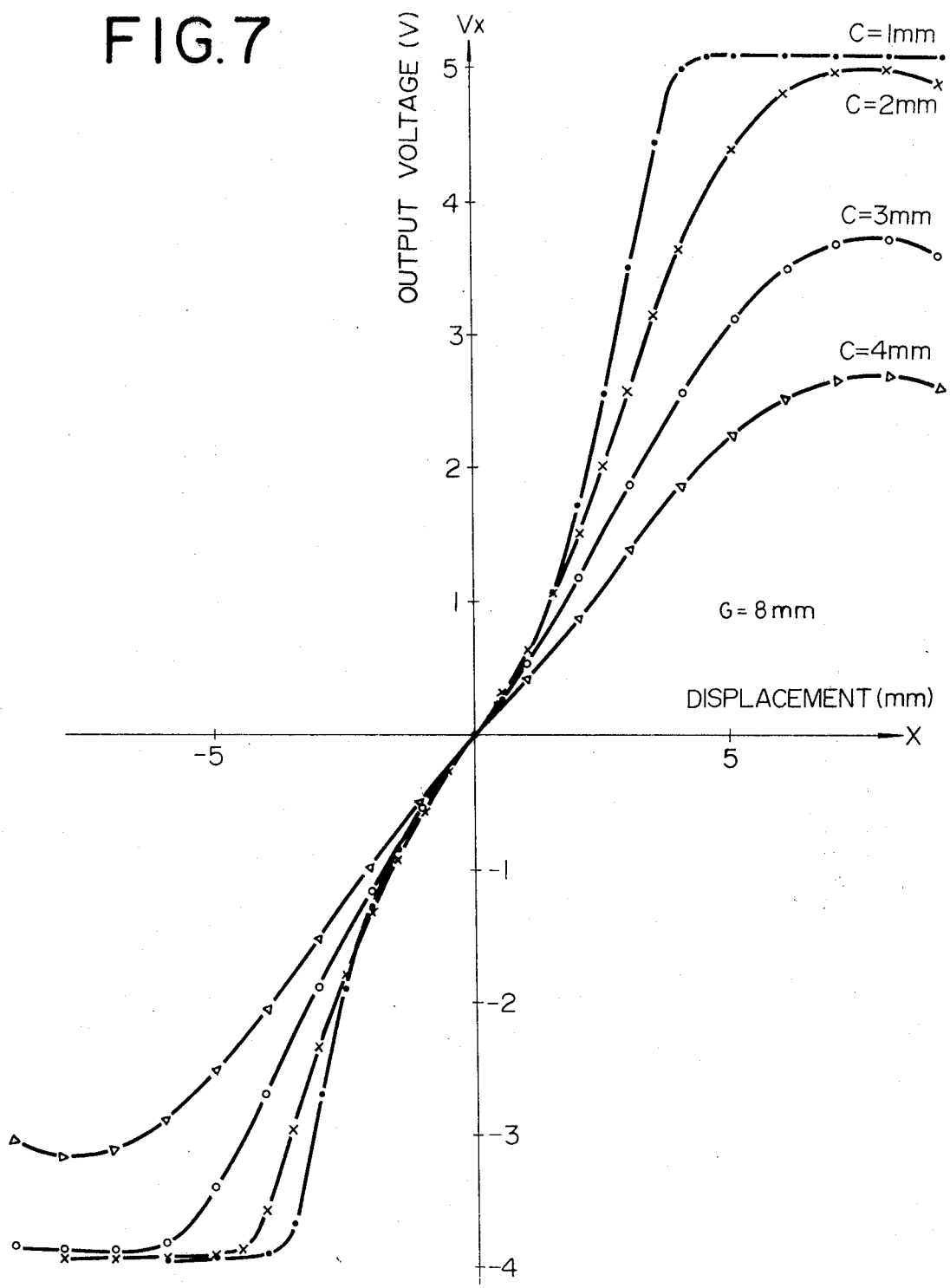
Figure 8:
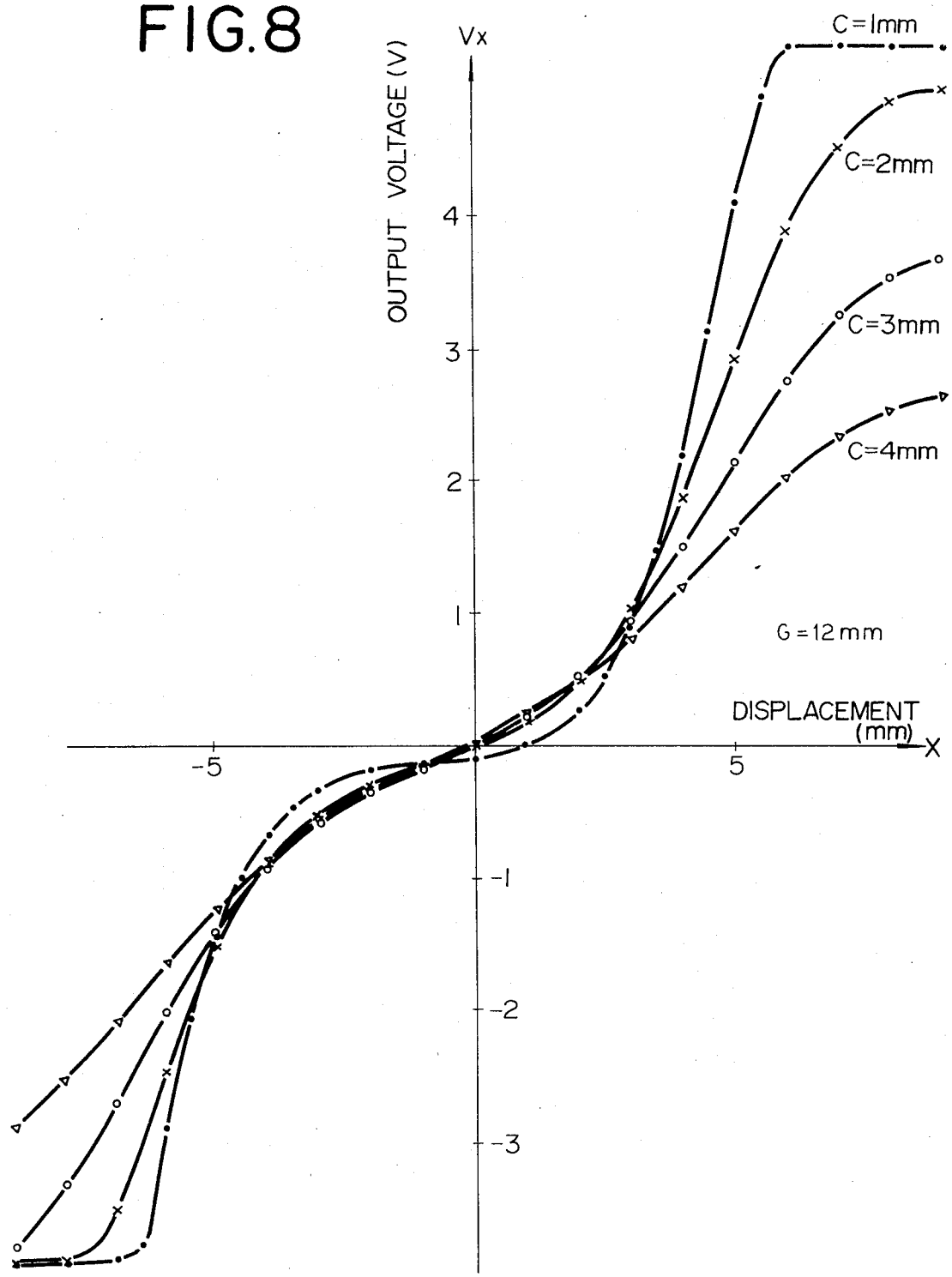

Let it be assumed that magnets 31 and 32 are barium-ferrite (BaFe) magnets. Let it be further assumed that these magnets exhibit equal dimensions, and each has a height, or thickness h=5.6 mm, a length a in the direction of displacement, wherein a=8 mm, and a width b=4 mm. The voltage-displacement relationship of magnetic sensor 20, that is, the relationship between the output voltage V derived therefrom and the displacement of magnetic sensor 20 relative to the center portion of gap G is a function of the gap dimension. This voltage-displacement relationship also is a function of the clearance C between the magnetic sensor and the top surface of signal field generator 30. FIG. 6 is a graphical representation of this relationship when the gap G=4.2 mm, and the clearance is established as C=1 mm, C=2 mm and C=3 mm. FIG. 7 is a graphical representation of the voltage-displacement relationship when the gap G=8 mm. FIG. 8 is a graphical representation of the voltage-displacement relationship when the gap G=12 mm.

From FIGS. 6-8, it is seen that, in accordance with the embodiment in FIG. 5, the output voltage V derived from magnetic sensor 20 changes uniformly as a function of the relative displacement between the magnetic sensor and signal field generator 30. Furthermore, it is recognized that the effective operating range for this embodiment is enlarged over that for the arrangement shown in FIG. 2. That is, the peak of the characteristic curve, such as the positive and negative peaks shown in FIG. 4, occurs at a displacement which is substantially greater than the occurrence of the peaks in FIG. 4. That is, with the present invention, the characteristic curve exhibits a positive slope over a greater range of displacement than was exhibited by the characteristic curve shown in FIG. 4.

Figure 9:
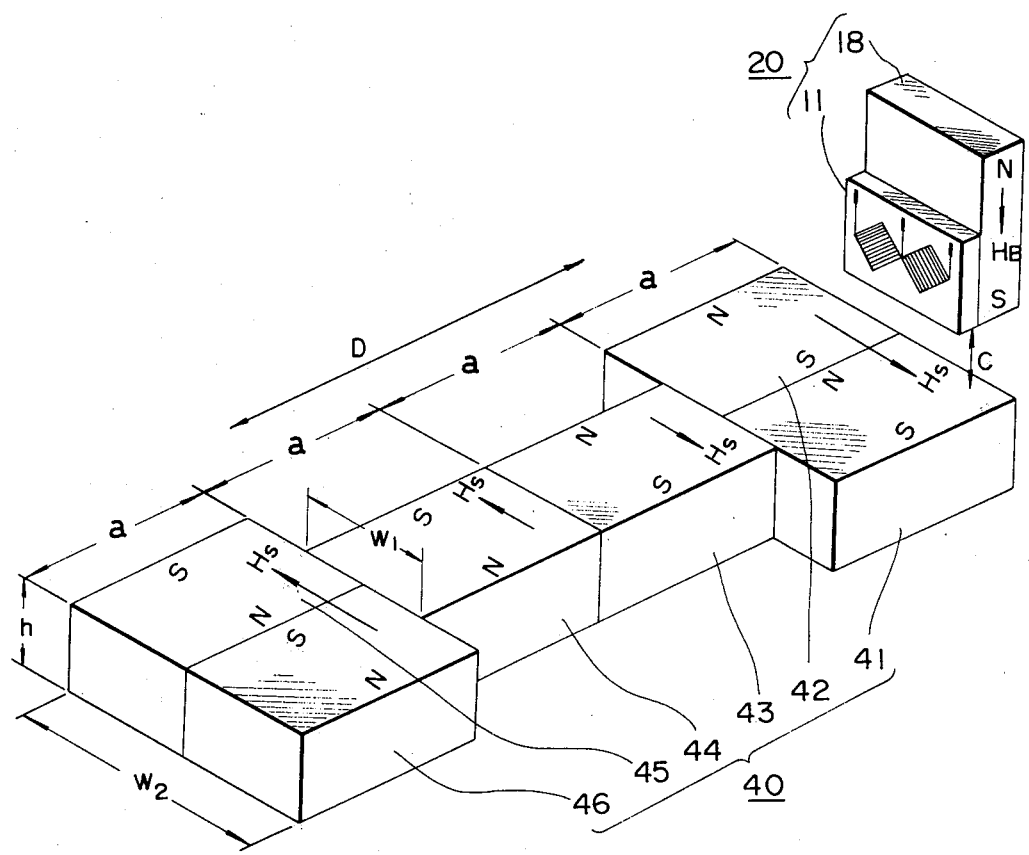
FIG. 9 is a schematic, perspective illustration of another embodiment of the present invention.

Referring now to FIG. 9, there is illustrated another embodiment of the present invention, wherein magnetic sensor 20 is similar to that described above with respect to FIG. 5, except that, in this embodiment, bias field $H_B$ is supplied in what is illustrated as the vertical direction. In FIG. 9, signal field generator 40 is comprised of magnets 41–46. Magnets 41 and 42 are poled so as to produce the signal field $H_S$ in the illustrated direction. It is seen that this signal field $H_S$ is perpendicular to bias field $H_B$, is parallel to the surface of magnetoresistive device 11, and is perpendicular to the direction of displacement, the latter being indicated by the arrow D. Although this signal field $H_S$ is represented as being generated by two source magnets, it may be appreciated that, if desired, a single source magnet having comparable dimensions may be used.

Magnets 45 and 46 are similar to magnets 41 and 42 and are spaced therefrom in the direction of displacement D. Furthermore, magnets 45 and 46 generate the signal field $H_S$ of opposite polarity, this signal field nevertheless being perpendicular to bias field $H_B$, being parallel to the surface of magnetoresistive device 11 and being perpendicular to the direction of displacement. Separate source magnets 45 and 46 may be replaced by a signal source magnet of comparable dimensions capable of generating the same signal field $H_S$.

Source magnets 41,42 and source magnets 45,46 are separated by source magnets 43 and 44. Magnet 43 generates signal field $H_S$ of the same polarity as the signal field $H_S$ generated by source magnets 41,42. Source magnet 44 generates the signal field $H_S$ of polarity opposite to that generated by magnet 43 and, thus, of the same polarity as the signal field $H_S$ generated by source magnets 45,46. Thus, if it is assumed that magnets 41,42 are separated from magnets 45,46 by a gap, magnets 43 and 44, generating signal fields $H_S$ of opposite polarities, are disposed in this gap.

Figure 10:
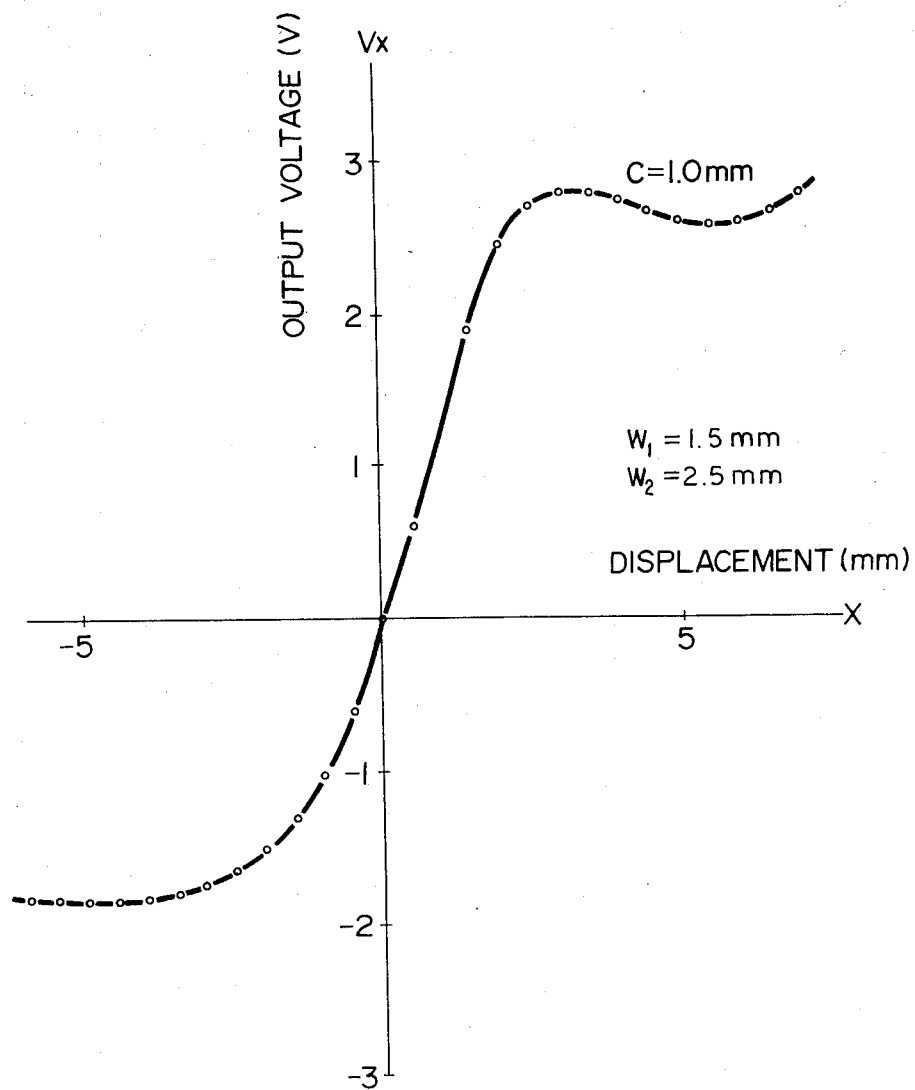
FIGS. 10 and 11 are graphical representations of the characteristic curves which are obtained from the embodiment shown in FIG. 9.
Figure 11:
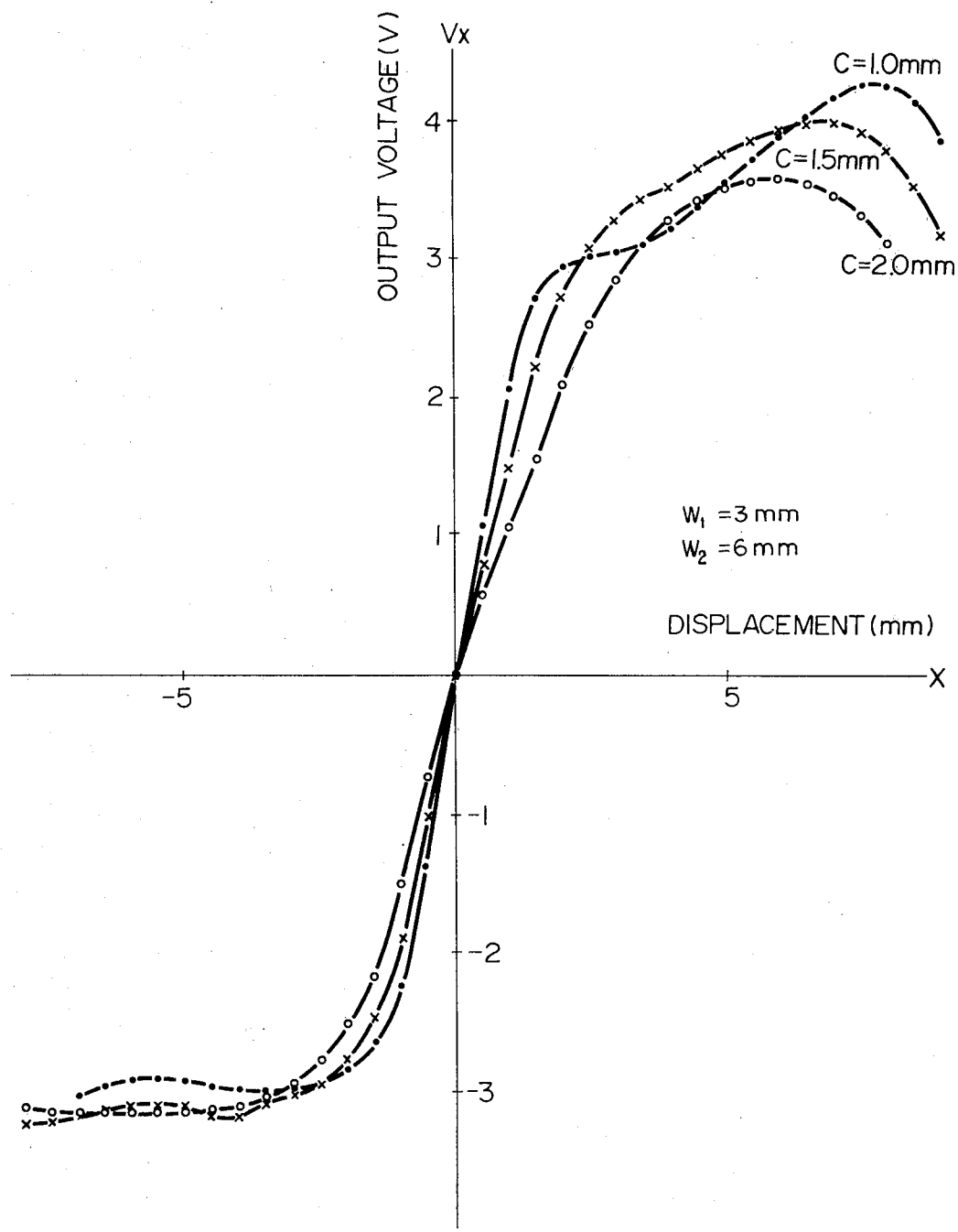

Each of magnets 41–46 is of equal length a, and the width of magnets 41–42, in combination, as well as the width of magnets 45,46, in combination, is equal to $W_2$. The width of each of magnets 43 and 44 is $W_1$. Thus, the magnets disposed in the gap are of reduced width relative to the magnets at opposite ends of signal field generator 40. If these magnets are samarium-cobalt (SmCo) magnets of thickness, or height, h=3 mm, and if length a=4 mm, then the voltage-displacement characteristic derived from magnetic sensor 20 is a function of the different widths $W_1$ and $W_2$, and also a function of the clearance C between the magnetic sensor and the signal field generator. FIG. 10 illustrates this voltage-displacement relationship when $W_1$=1.5 mm, $W_2$=2.5 mm and C is 1.0 mm. FIG. 11 is a graphical representation of this relationship when $W_1$=3 mm and $W_2$=6 mm, this relationship being shown for different clearances of C=1.0 mm, C=1.5 mm and C=2.0 mm. From FIGS. 10 and 11, it is seen that the output voltage V derived from magnetic sensor 20 changes uniformly as the displacement between this magnetic sensor and the boundary line between magnets 43 and 44 changes. Furthermore, the effective detection range, that is, the range over which the output voltage V remains on substantially the positive slope of the characteristic curve, is enlarged if the width $W_1$ of those source magnets which are disposed in the central portion of signal field generator 40 is reduced.

Figure 12:
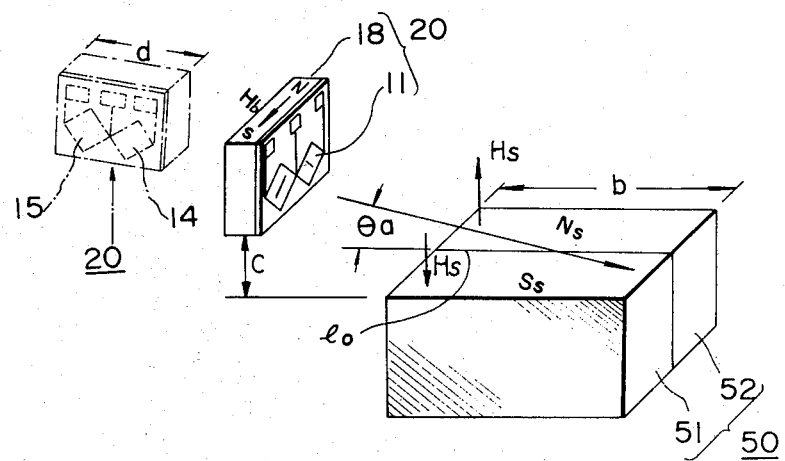
FIG. 12 is a schematic, perspective illustration of yet another embodiment of the present invention.

Yet another embodiment is illustrated in FIG. 12, wherein magnetic sensor 20 is substantially the same as that described above with respect to FIG. 5; and signal field generator 50 is comprised of source magnets 51 and 52. As one example thereof, source magnet 51 is provided with a south (S) pole face and source magnet 52 is provided with a north (N) pole face, these source magnets having a boundary line $l_o$ therebetween extending generally in the direction of displacement of the magnetic sensor relative to the signal field generator. In this embodiment, however, magnetic sensor 20 is relatively displaced along a path which is disposed at an angle $\theta_a$ with respect to boundary line $l_o$. Desirably, but not necessarily, this displacement path of magnetic sensor 20 intersects boundary line $l_o$ at substantially its mid-point.

As one example, in the embodiment of FIG. 12, magnetic sensor 20 is spaced from the top surface of signal field generator 50 by the clearance C, and the plane of the surface of magnetoresistive device 11 is substantially perpendicular to the direction of displacement of the magnetic sensor. As another example thereof, the plane of the surface of magnetoresistive device 11 is perpendicular to boundary line $l_o$. In the former example, that is, with the surface of the magnetoresistive device being perpendicular to the displacement path thereof, the output voltage V exhibits a greater value for the same value of displacement.

Figure 13:
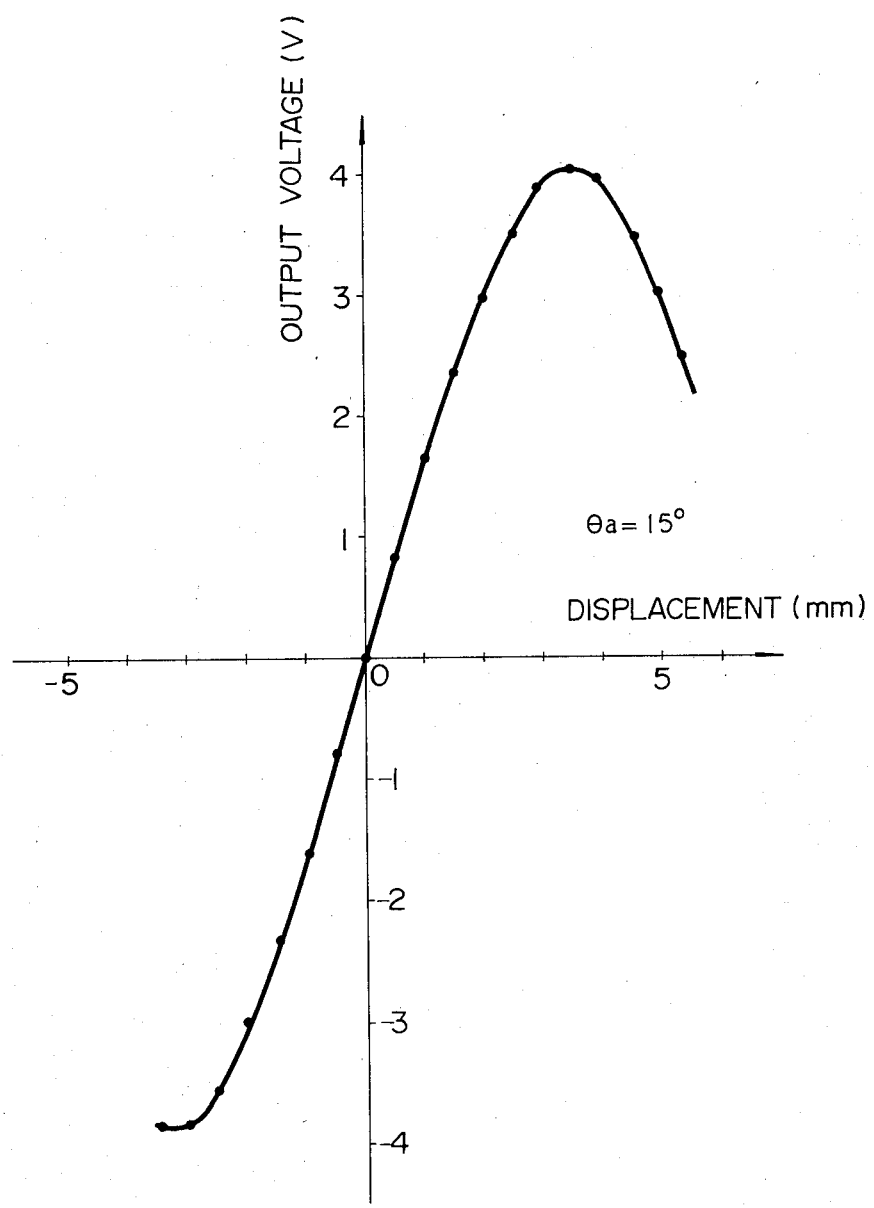
FIG. 13 is a graphical representation of the characteristic curve which is obtained from the embodiment shown in FIG. 12.
Figure 14:
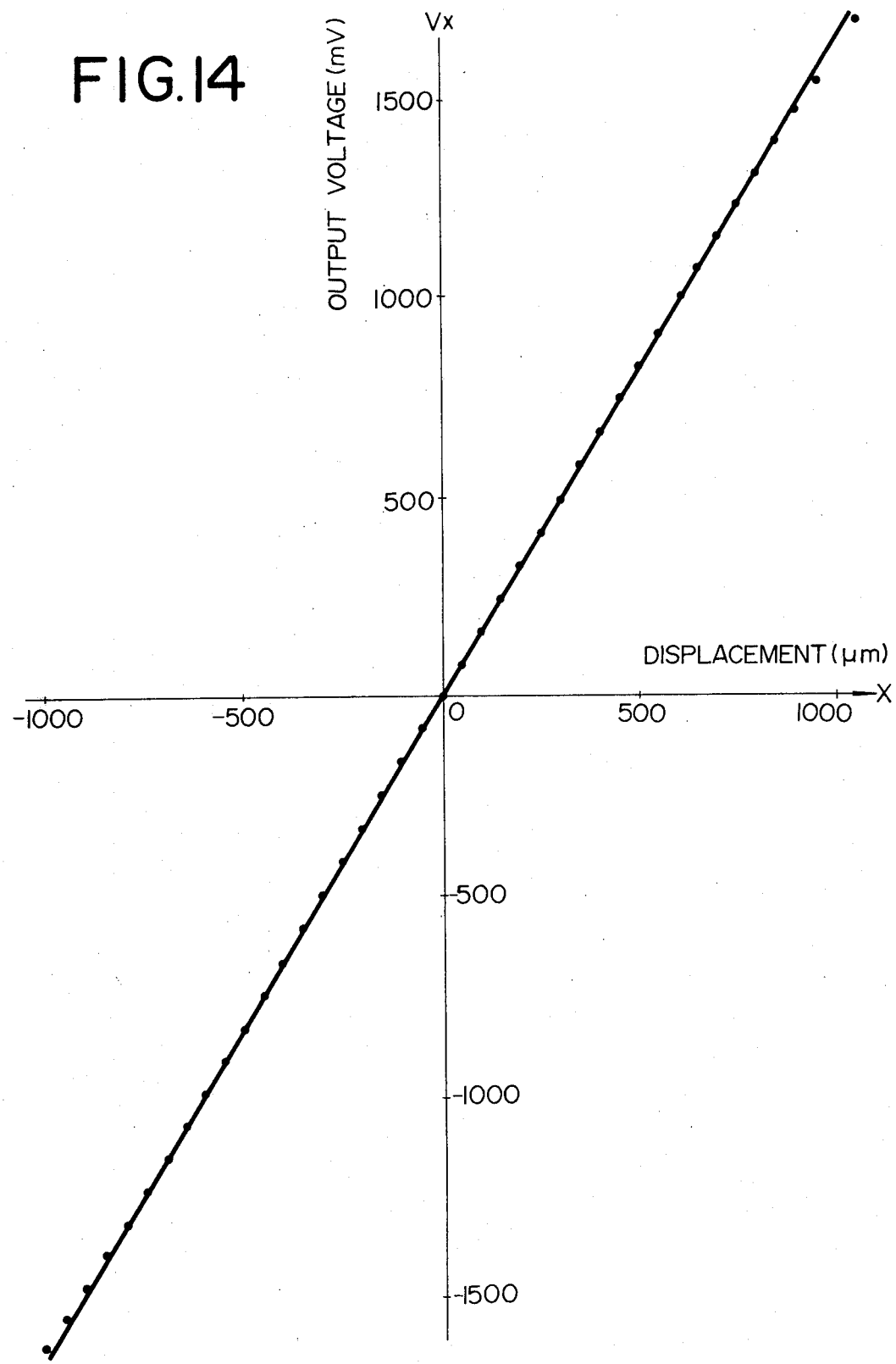
FIG. 14 is a graphical representation of a portion of the characteristic curve shown in FIG. 13.

The angle $\theta_a$ of the displacement path relative to the boundary line $l_o$ is within the range 0° to 90° ($0° < \theta_a < 90°$). FIG. 13 is a graphical representation of the voltage-displacement characteristic for the embodiment shown in FIG. 12 wherein the angle $\theta_a$=15°. This characteristic has been obtained for the embodiment wherein the length b of signal field generator 50 is equal to 8 mm and the clearance C is equal to 0.5 mm. FIG. 14 is a graphical representation of the same voltage-displacement relationship, but is limited to the vicinity of zero output voltage. From FIG. 13, it is appreciated that the detection range is expanded over that represented by the characteristic curve of FIG. 4, and the linear voltage-displacement relationship in the vicinity of zero output voltage (which also is in the vicinity of zero displacement) is highly satisfactory, as is seen from FIG. 14.

In the embodiment of FIG. 12 described hereinabove, the surface of magnetoresistive device 11 is disposed perpendicular to the displacement path (or to the boundary line $l_o$). As a modification, the surface of the magnetoresistive device may be disposed in the direction parallel to the displacement path (or to the boundary line), as represented by the phantom lines in FIG. 12.

Figure 15:
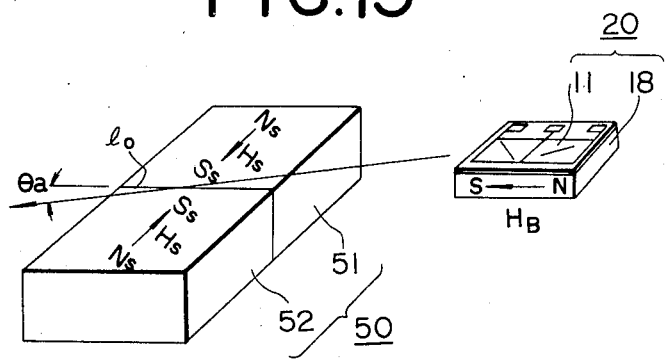
FIGS. 15 and 16 are schematic, perspective illustrations of variations of the embodiment shown in FIG. 12.
Figure 16:
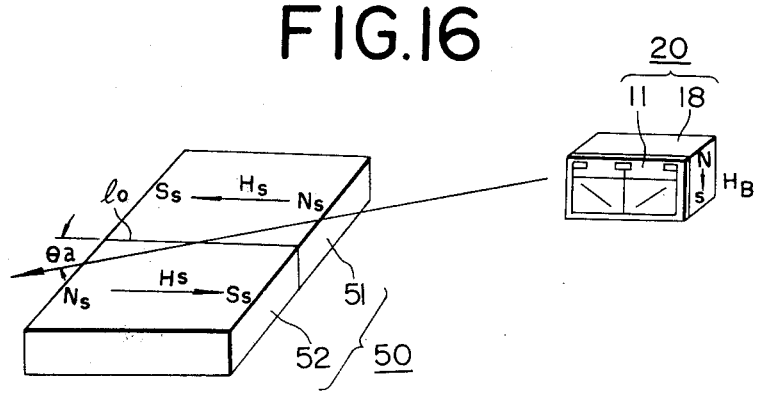

Further modifications of the embodiment shown in FIG. 12 are represented in FIGS. 15 and 16. In FIG. 15, the surface of magnetoresistive element 11 is parallel to the top surface of signal field generator 50. The bias field $H_B$ is generally in the direction of displacement of magnetic sensor 20, and source magnets 51 and 52 generate signal fields $H_S$ of opposite polarities and parallel to the top surface of the signal field generator. Nevertheless, magnetic sensor 20 is displaced in the direction which forms the angle $\theta_a$ with boundary line $l_o$.

In FIG. 16, magnetic sensor 20 is disposed in the configuration similar to that shown in phantom lines in FIG. 12, and signal field generator 50 is comprised of source elements 51 and 52 which generate signal fields $H_S$ of opposite polarities and in the general direction of displacement. That is, these signal fields are in the direction substantially parallel to boundary $l_o$. In the FIG. 16 embodiment, magnetic sensor 20 is displaced in a direction at the angle $\theta_a$ with respect to the boundary line.

It is appreciated that, in the embodiments shown in FIGS. 12, 15 and 16, as magnetic sensor 20 is displaced, the signal field supplied thereto gradually decreases in intensity as the magnetic sensor approaches the cross-over point along boundary line $l_o$. When the magnetic sensor is displaced beyond this cross-over point, the signal field polarity changes over and then gradually increases. From FIGS. 13 and 14, it is appreciated that the output voltage produced by magnetic sensor 20 generally is linearly related to the detected signal field. That is, as the magnetic sensor approaches the cross-over point, its output voltage gradually decreases, then changes over in polarity, and then gradually increases as the magnetic sensor continues to be displaced.

Figure 17:
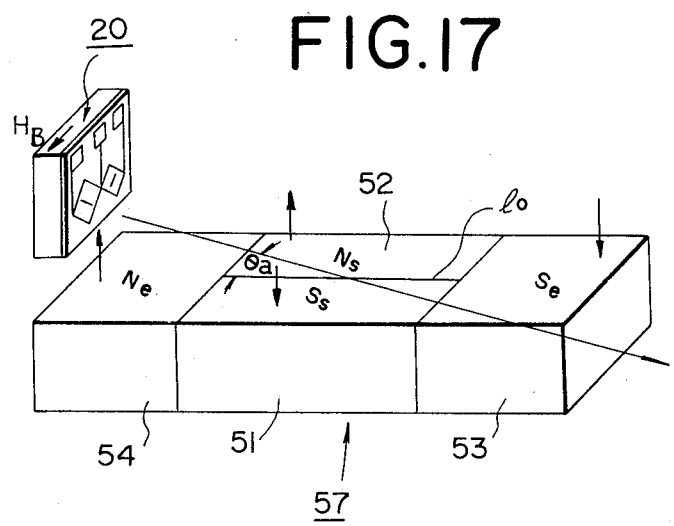
FIG. 17 is a schematic, perspective illustration of another modification of the embodiment shown in FIG. 12.

FIG. 17 is a modification of the embodiment shown in FIG. 12, wherein signal field generator 57 is comprised of source magnets 51 and 52, as before, whose opposite ends are provided with additional source magnets 53 and 54. Additional source magnets 53 and 54 generate signal fields in the direction parallel to the signal fields generated by source magnets 51 and 52. The signal fields generated by additional source magnets 53 and 54 exhibit opposite polarities with respect to each other. In the example shown, additional source magnet 54 is provided with a north (N) pole face and additional source magnet 53 is provided with a south (S) pole face. The width of each of additional source magnets 53 and 54 is equal to the width of combined source magnets 51 and 52.

Figure 18:
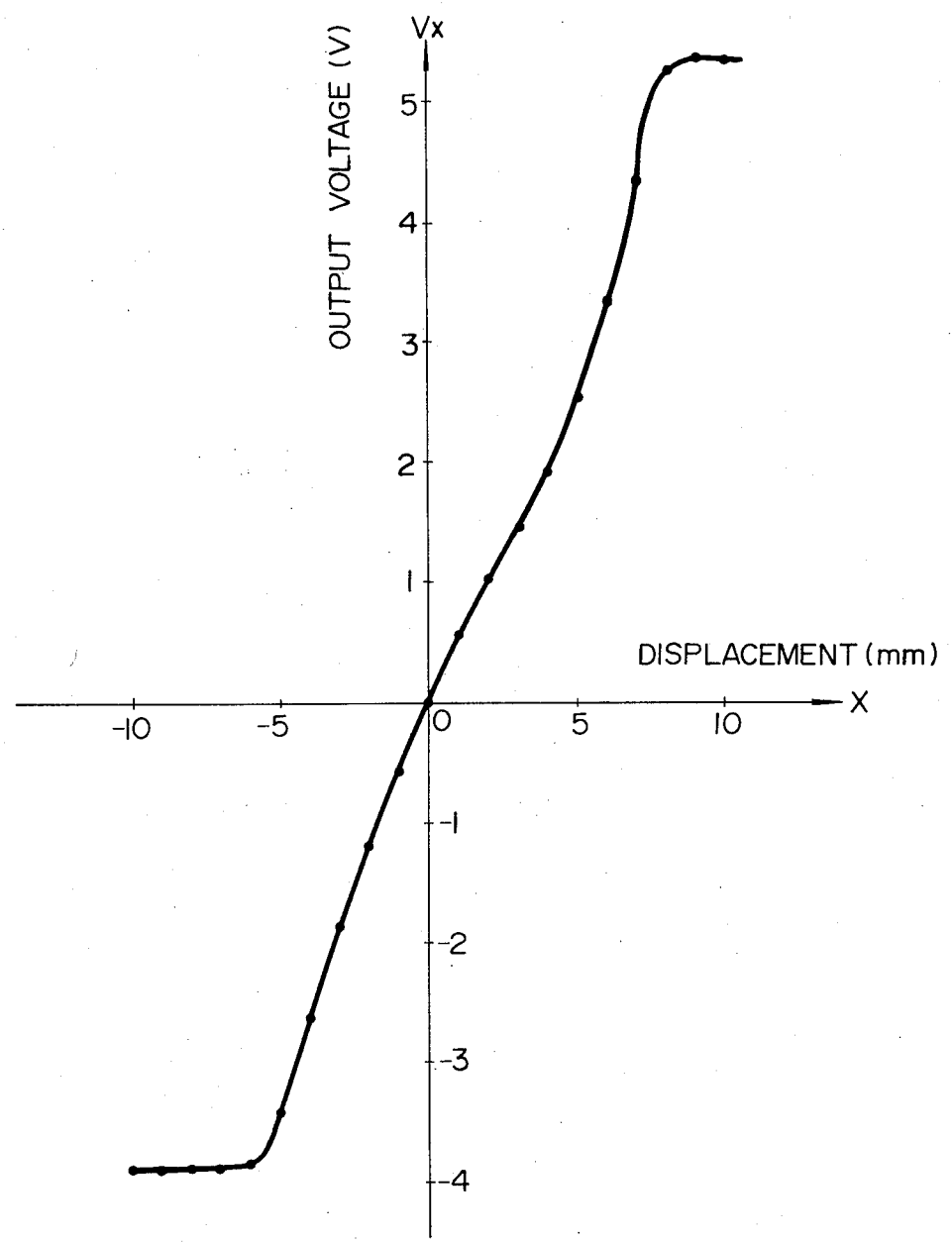
FIG. 18 is a graphical representation of the characteristic curve which is obtained from the embodiment shown in FIG. 17.

If magnetic sensor 20 is assumed to be displaced along the illustrated displacement path at the angle $\theta_a$ with respect to boundary line $l_o$, this magnetic sensor is supplied initially with a signal field of north polarity, generated by additional source magnet 54, then the magnetic sensor is displaced across boundary line $l_o$, and then the magnetic sensor is supplied with the signal field of south polarity generated by additional source magnet 53. The output voltage V produced by the magnetic sensor in response to this displacement across the top surface of signal field generator 57 is illustrated by the characteristic curve shown in FIG. 18.

Figure 19:
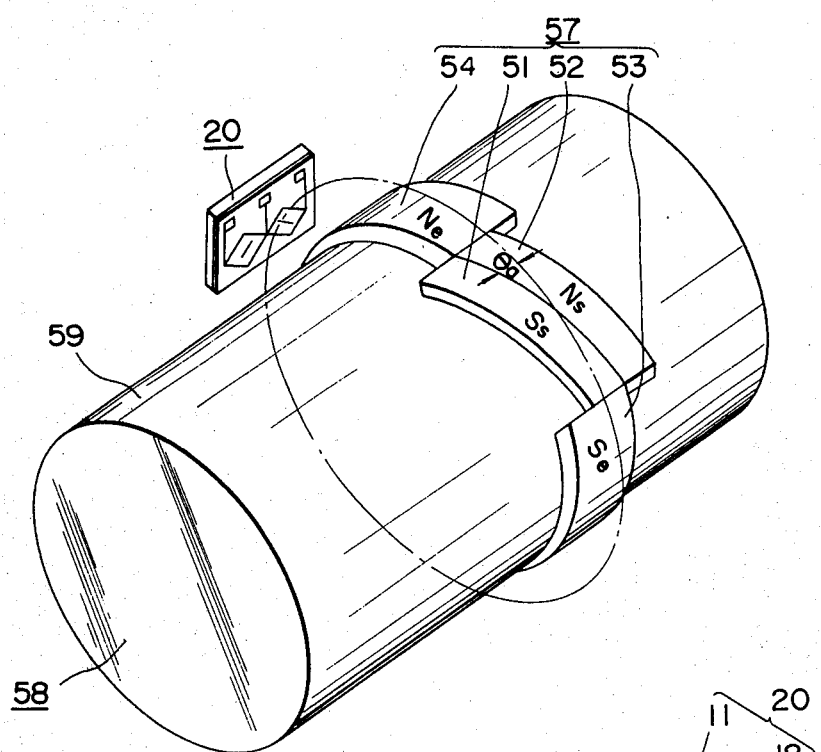
FIG. 19 is a schematic, perspective illustration of a practical embodiment of the arrangement shown in FIG. 17.

The embodiment shown particularly in FIG. 17, comprised of face-to-face source magnets 51 and 52 which are interposed between additional source magnets 53 and 54, is particularly adapted for controlling a motor-driven rotary member. For example, if magnetic sensor 20 is fixedly disposed and signal field generator 57 is adapted to be rotary displaced with respect thereto, the characteristic curve shown in FIG. 18 may be used to position the rotary member such that it is driven to its "zero-displacement" point. For example, the rotary member may be controlled so as to bring the cross-over point (e.g. the point defined by the intersection of boundary line $l_o$ and the displacement path) into predetermined position. If, because of inertia, the rotary member travels beyond this zero-displacement point, the control system may be properly driven so as to return the zero-displacement point to its proper location. One embodiment of the arrangement shown in FIG. 17 for controlling the rotary position of such a rotary member is illustrated in FIG. 19. As shown therein, signal field generator 57 is comprised of of magnets 51-54 which may be formed of flexible magnetic rubber material bonded to peripheral surface 59 of rotary member 58. As an example thereof, the rotary member may be a rotor, a driven shaft, or the like. Magnetic sensor 20 is fixedly disposed with respect to signal field generator 57. To provide the angular relationship between boundary line $l_o$ and the rotary path of displacement, source magnets 51 and 52 are offset relative to each of additional source magnets 53 and 54, as shown. Alternatively, magnets 51-54 may be aligned and disposed on the peripheral surface 59 in a skewed relationship to the circular generatrix.

Figure 20:
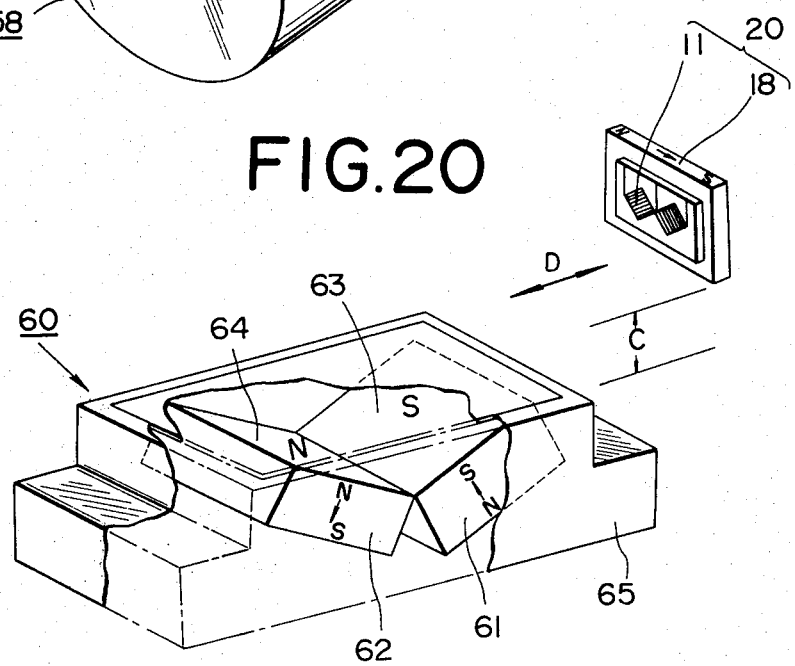
FIG. 20 is a schematic, perspective illustration of yet another embodiment of the present invention.

A still further embodiment of the present invention is illustrated in FIG. 20, wherein magnetic sensor 20 is similar to that shown in FIG. 17, and wherein signal field generator 60 is comprised of magnets 61 and 62 having south (S) and north (N) pole faces, respectively. The surfaces of magnets 61 and 62 lie in intersecting planes, with these surfaces abutting each other to define a boundary line whereat the signal field polarity, as detected by magnetic sensor 20, changes over. Surfaces 63 and 64 of magnets 61 and 62 are angularly disposed from each other, and these surfaces are seen to slope in the upward direction from the boundary line. If the opposite, or free ends of inclined surfaces 63 and 64, that is, the opposite edges of inclined magnets 61 and 62, are assumed to lie in a common plane, the boundary line between these magnets is seen to be disposed beneath this plane. In FIG. 20, magnetic sensor 20 is assumed to be spaced from this common place by the clearance C. Hence, the clearance between the magnetic sensor and the boundary line is greater than the clearance between the magnetic sensor and the opposite edges of the magnets. Hence, if magnetic sensor 20 is assumed to be displaced in the direction represented by arrow D, the clearance C between the magnetic sensor and surfaces 63 and 64 increases until the magnetic sensor is juxtaposed the boundary line, and then this clearance gradually decreases.

In one arrangement of the embodiment shown in FIG. 20, magnets 61 and 62 are disposed in a resin molded case 65.

Various modifications of the embodiment shown in FIG. 20 are represented in FIGS. 21A-21D. FIG. 21A is substantially similar to the arrangement shown in FIG. 20, in that magnets 61 and 62 generate signal fields in the generally vertical direction. These signal fields are, of course, perpendicular to bias field $H_B$, and also are perpendicular to the direction of displacement of magnetic sensor 20. In FIG. 21B, it is assumed that bias field $H_B$ is in the generally vertical direction, and the signal fields of opposite polarities, produced by magnets 61' and 62' of signal field generator 60' are in the generally horizontal direction.

In FIG. 21C, magnets 61 and 62 are assumed to be separated from each other by a gap G. Thus, whereas in the embodiment of FIG. 20, the boundary portion between magnets 61 and 62 is a simple boundary line, the boundary portion between magnets 61 and 62 in FIG. 21C extends over the gap G.

FIG. 21B is similar to the arrangements shown in FIGS. 21A and 21B, except that the respective magnets of signal field generator 60 here are shown as being formed of a flexible magnetizing material, such as magnetic rubber, or the like. This flexible material is bent at the central boundary portion thereof, and signal fields of opposite polarities are produced on either side of this boundary.

Figure 22:
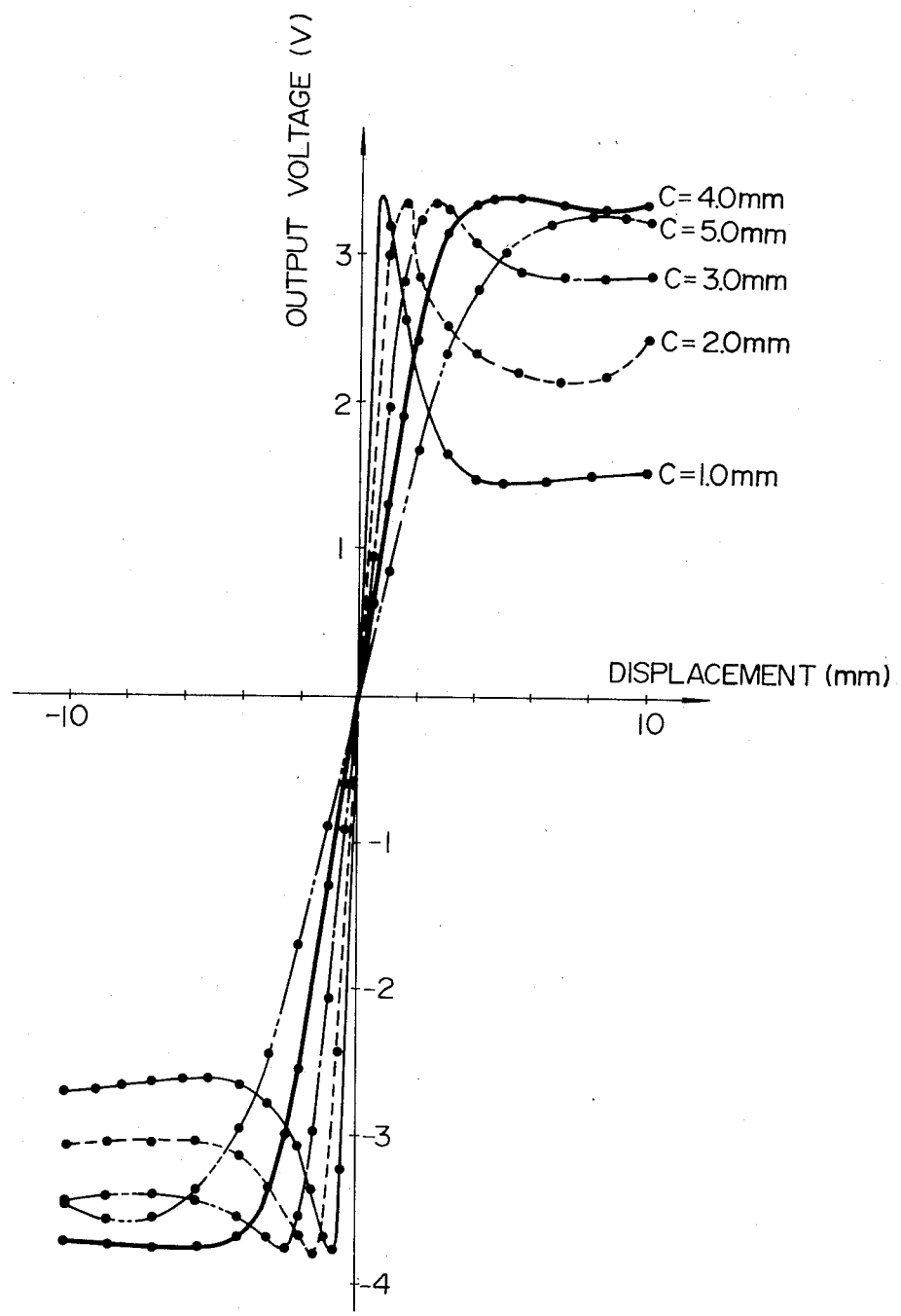
FIGS. 22–24 are graphical representations of characteristic curves which are derived from the embodiments shown in FIGS. 20 and 21.

FIG. 22 is a graphical representation of the voltage-displacement relationship for the arrangement wherein magnets 61 and 62 (FIG. 20) are not angularly disposed with respect to each other. The curves of FIG. 22 thus may be viewed as reference curves. To obtain these curves, it is assumed that magnets 61 and 62 are anisotropic barium-ferrite magnets whose overall length is 14 mm, and having a width of 5 mm and thickness, or height, of 4 mm. The clearance C between the the common surface of these magnets and magnetic sensor 20 is selected at 1.0 mm, 2.0 mm, 3.0 mm, 4.0 mm and 5.0 mm.

Figure 23:
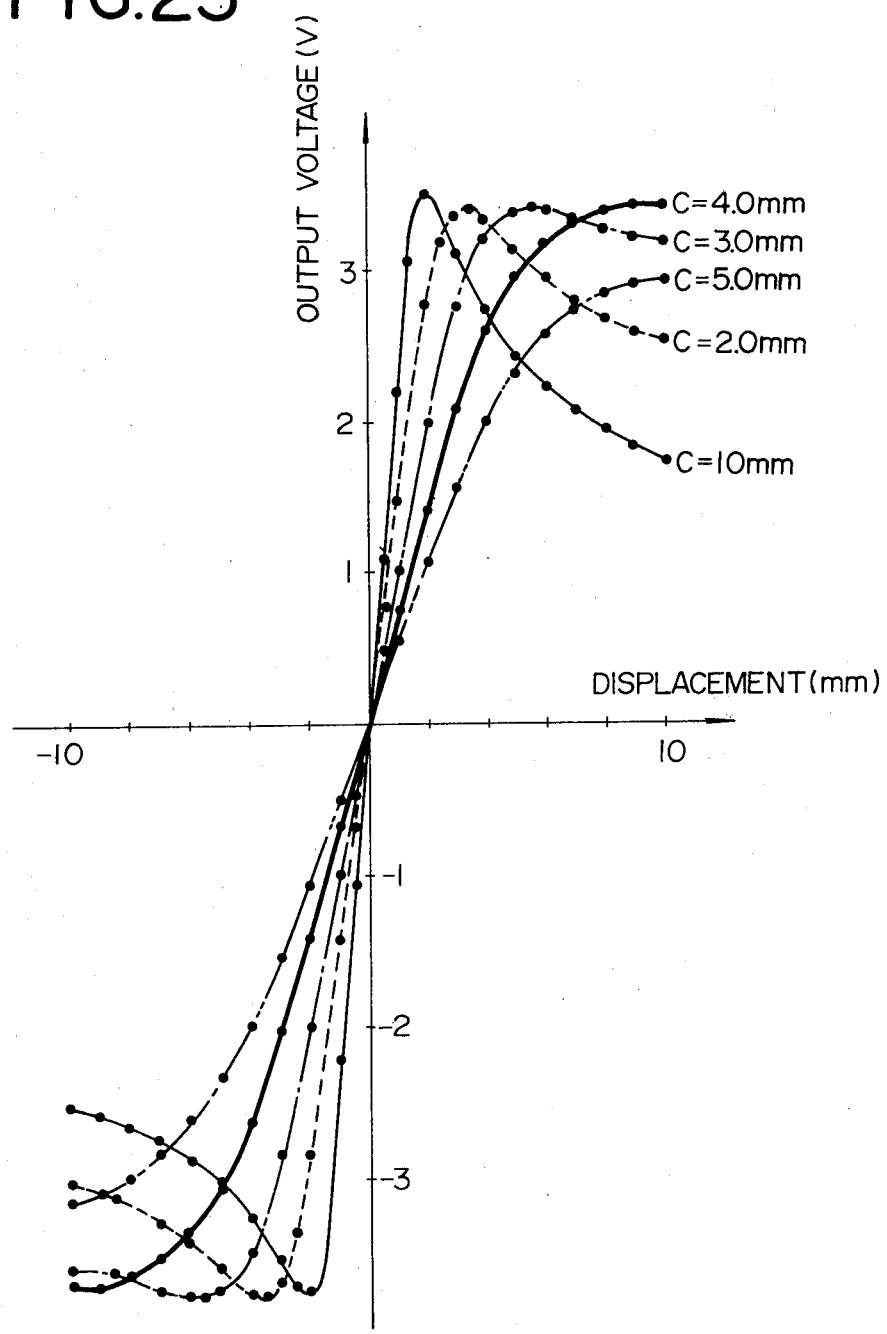

FIG. 23 is a graphical representation of the voltage-displacement relationship for the embodiment shown in FIG. 21A. In this embodiment, barium-ferrite magnets 61 and 62 exhibit the same dimensions as those which were used to derive the curves shown in FIG. 22, except that, to obtain the curves of FIG. 23, magnets 61 and 62 are angularly disposed with respect to each other such that the boundary line is inclined below the common surface in which the opposite edges of these magnets lie by 2 mm. The respective curves illustrated in FIG. 23 are obtained for different clearances, wherein C=1.0 mm, C=2.0 mm, C=3.0 mm, C=4.0 mm and C=5.0 mm.

Figure 24:
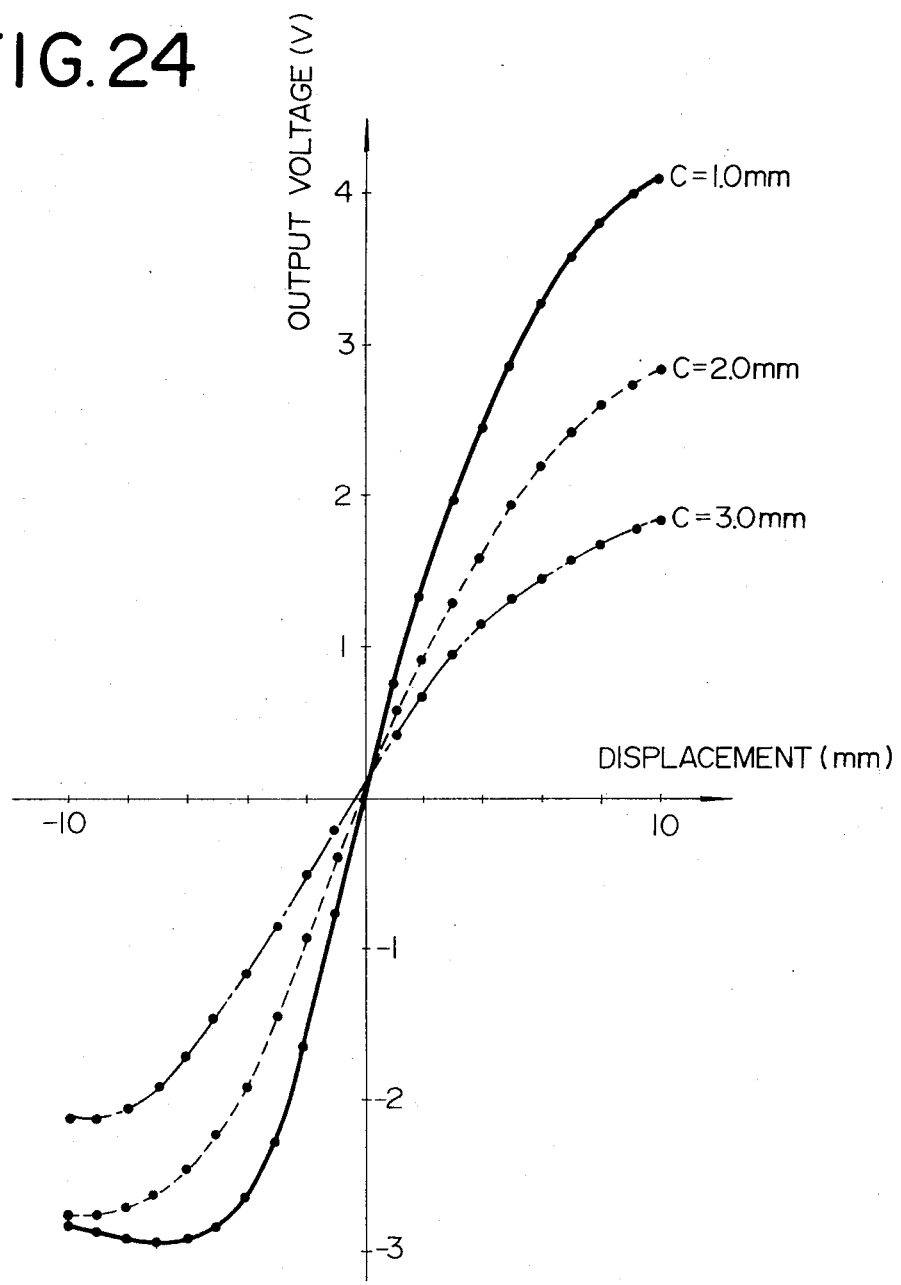

FIG. 24 is a graphical representation of the voltage-displacement relationship for the embodiment shown in FIG. 21B. In this embodiment, the boundary line defined by the inclined, abutting magnets 61',62' lies below the surface in which the opposite edges of these magnets lie by 2 mm. In FIG. 24, each curve has been derived from a respective clearance, wherein C=1.0 mm, C=2.0 mm and C=3.0 mm.

From FIGS. 22-24, it is seen that the detecting range for the embodiment shown in FIG. 20, and the variations of FIGS. 21A and 21B, is expanded relative to the detecting range represented by the curves of FIG. 22. Furthermore, in FIGS. 23 and 24, the output voltage V is seen to change uniformly over a relatively wide range of displacement. Hence, the embodiment shown in FIG. 20 (and the variations of FIGS. 21A and 21B) are particularly adapted for use in position-detecting applications, such as in servo control systems.

In accordance with another aspect of the present invention, the sensitivity of the magnetic sensor may be improved, such that the output voltage V derived therefrom exhibits a relatively large change in value in response to a relatively small change in displacement, yet maintains a desirable linear relationship with respect to displacement. This objective is attained in accordance with the embodiment shown in FIG. 25. In this embodiment, two separate magnetic sensors 20A and 20B are used, these magnetic sensors producing output voltages $e_1$ and $e_2$, respectively. A combining circuit 100 produces an output voltage $e_o$ in response to these respective voltages $e_1$ and $e_2$ supplied thereto.

Figure 26:
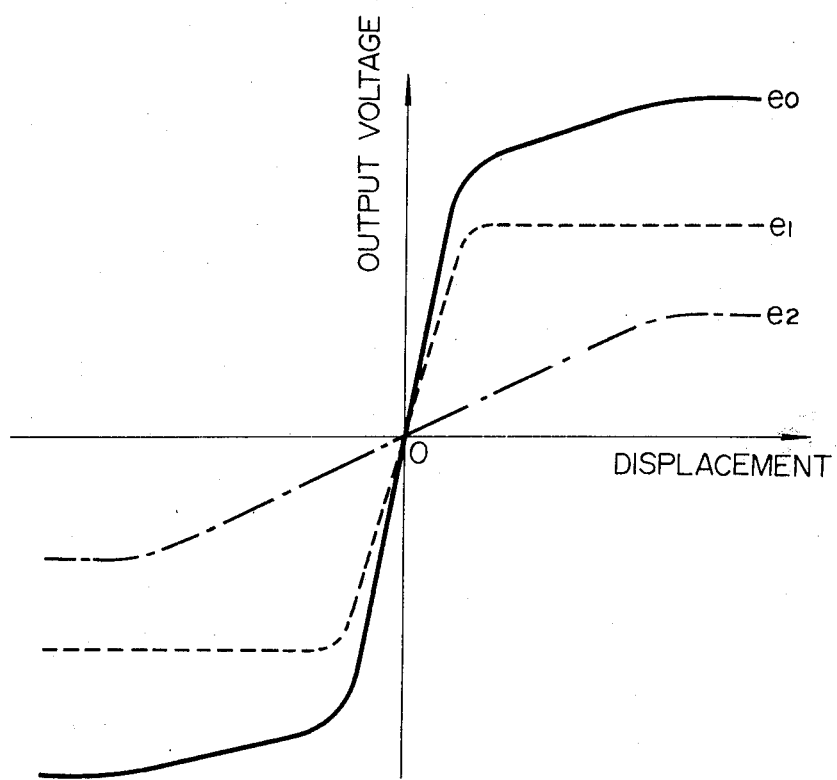
FIG. 26 is a graphical representation of characteristic curves which are useful in understanding the operation of the embodiment shown in FIG. 25.

Magnetic sensor 20A may be of the type shown in FIG. 2, that is, it may produce output voltage $e_1$ in response to the signal field $H_S$ generated by source magnet 19. Magnetic sensor 20B may be of the type described hereinabove with respect to the present invention, that is, it may produce output voltage $e_2$ in response to signal field generators of the type shown in, for example, FIGS. 5, 9, 12, 15, 16, 17, 20, 21A-21D. Output voltage $e_1$ may be of the type shown in FIG. 4, and is re-drawn as the broken curve shown in FIG. 26. Output voltage $e_2$ may be of the type discussed hereinabove and is obtained in accordance with the various embodiments of the present invention. A graphical representation of output voltage $e_2$ also is shown in FIG. 26.

Combining circuit 100 is comprised of an inverting amplifier $A_1$ and a difference amplifier $A_2$. Inverting amplifier $A_1$ includes a negative, or inverting, input coupled via an input resistor $R_1$ to receive voltage $e_1$. A feedback resistor $R_f$ is interconnected between the output and the negative input of amplifier $A_1$. This amplifier also includes a positive, or non-inverting input coupled, via a resistor, to a reference potential, such as ground. Amplifier $A_1$ is a unity gain inverting amplifier. This amplifier produces a voltage $e'_1$, such that $e'_1 = -e_1$.

Amplifier $A_2$ includes a negative, or inverting input coupled, via a resistor $R_1$, to the output of unity gain inverting amplifier $A_1$. Amplifier $A_2$ also includes a positive, or non-inverting input coupled, via resistor $R_3$, to receive voltage $e_2$. This amplifier also includes a feedback resistor $R_2$ interconnected between the output thereof and its inverting input. Finally, a resistor $R_4$ is coupled between the non-inverting input and ground.

Amplifier $A_2$ functions as a difference amplifier to produce output voltage $e_o$ which is a function of the difference between voltages $e'_1$ and $e_2$, both being supplied to amplifier $A_2$. More particularly, the relationship between output voltage $e_o$, voltage $e'_1$ and voltage $e_2$ may be represented as:

$$e_o = \frac{R_4}{R_3 + R_4} \cdot \frac{R_1 + R_2}{R_1} \cdot e_2 - \frac{R_2}{R_1} e'_1 \quad (4)$$

A graphical representation of this output voltage $e_o$, and its relationship with respect to the displacement of magnetic sensors 20A and 20B relative to suitable signal field generators, is illustrated in FIG. 26.

If $R_1 = R_3$ and $R_2 = R_4$, equation (4) may be simplified as follows:

$$e_o = \frac{R_2}{R_1} (e_2 - e'_1) \quad (5)$$

$$= \frac{R_2}{R_1} (e_2 + e_1)$$

Thus, it is seen that combining circuit 100 functions to produce output voltage $e_o$ which is proportional to the sum of output voltages $e_1 + e_2$, the proportionality constant being equal to $R_2/R_1$.

Figure 27:
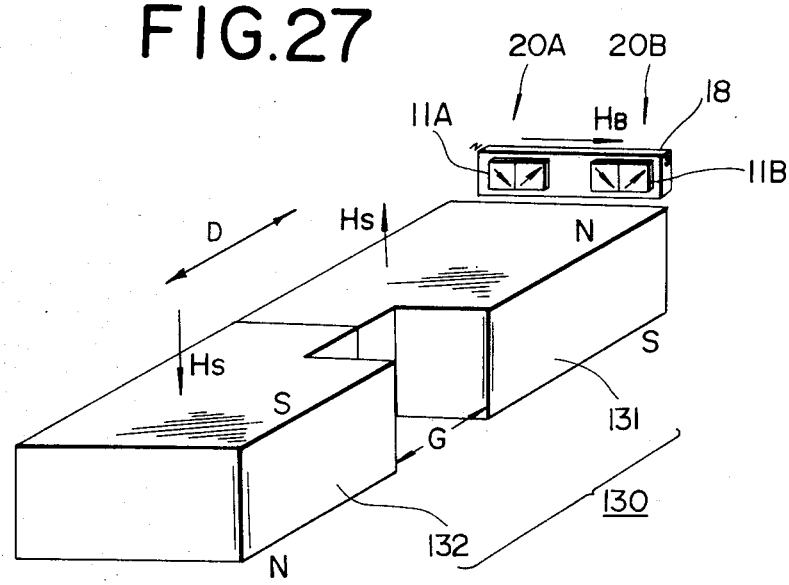
FIG. 27 is a schematic, perspective illustration of one arrangement which can be used in the embodiment shown in FIG. 25.

One embodiment of magnetic sensors 20A and 20B, in combination with suitable signal field generating means, is illustrated in FIG. 27. In this embodiment, a bias magnet 18 is used to generate bias field $H_B$ and, moreover, to support, or otherwise have mounted thereon, magnetoresistive devices 11A and 11B. Magnetoresistive device 11A may be similar to magnetoresistive device 11, shown in FIG. 2, and magnetoresistive device 11B may be similar to to magnetoresistive device 11 shown in FIG. 5. It is appreciated that magnetoresistive devices 11A and 11B are supported by bias magnet 18 in alignment with each other. That is, the surfaces of these devices are coplanar and, moreover, these devices are disposed in side-by-side relation. Bias field $H_B$ is supplied at an angle of 45° to each current path in each magnetoresistive device. Furthermore, although not shown herein, a suitable source of bias current is provided to supply respective bias currents to each magnetoresistive device.

The magnetic signal field $H_S$ supplied to each magnetoresistive device 11A and 11B is produced by a signal field generator 130. This signal field generator is comprised of, for example, two magnets 131 and 132, magnet 131 having a north (N) pole face and magnet 132 having a south (S) pole face. Magnetic sensors 20A and 20B are spaced from the common top surface of magnets 131 and 132, and these magnetic sensors are adapted to be displaced across this common surface in the displacement direction D.

It is seen that magnets 131 and 132 abut each other to define a boundary line substantially perpendicular to the direction of displacement of magnetic sensor 20A. That is, magnetic sensor 20A is displaced along a path which traverses this boundary line.

A central portion, or section, of magnets 131 and 132 is removed so as to provide the non-magnetic gap G therebetween. This gap G is disposed in the displacement path of magnetic sensor 20B so as to be traversed by this magnetic sensor when the latter is displaced.

Thus, the signal field $H_S$ detected by magnetic sensor 20A is similar to the signal field detected by magnetoresistive device 11 shown in FIG. 2. The signal field detected by magnetic sensor 20B is similar to the signal field detected by the magnetoresistive device described hereinabove with respect to FIG. 5. Consequently, magnetic sensor 20A produces the output voltage $e_1$ and magnetic sensor 20B produces the output voltage $e_2$, both of these voltages being graphically represented in FIG. 26. Thus, the signal field supplied to magnetic sensor 20B as this sensor is displaced relative to signal field generator 130 gradually is reduced in intensity and changes over from one polarity to the other as the sensor traverses gap G. At the same time, magnetic sensor 20A, which is displaced concurrently with sensor 20B, is supplied with a signal field which undergoes a relatively abrupt change-over from one polarity to the other. It is appreciated that this relatively abrupt change-over occurs at the boundary line between magnets 131 and 132.

Output voltages $e_1$ and $e_2$ produced by magnetic sensors 20A and 20B, respectively, are supplied to combining circuit 100 whereat they are summed to produce the resultant output voltage $e_o$, shown in FIG. 26. This resultant output voltage exhibits desirably high sensitivity to the displacement of the magnetic sensors relative to signal field generator 130 and, moreover, exhibits a detecting range which is improved over that associated with output voltage $e_1$.

Figure 25:
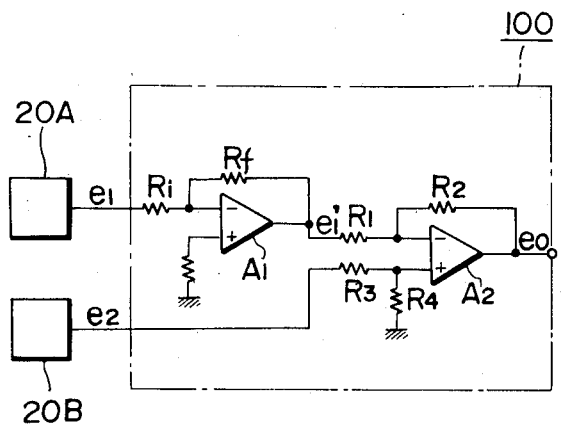
FIG. 25 is a schematic diagram of yet another embodiment of the present invention.
Figure 28:
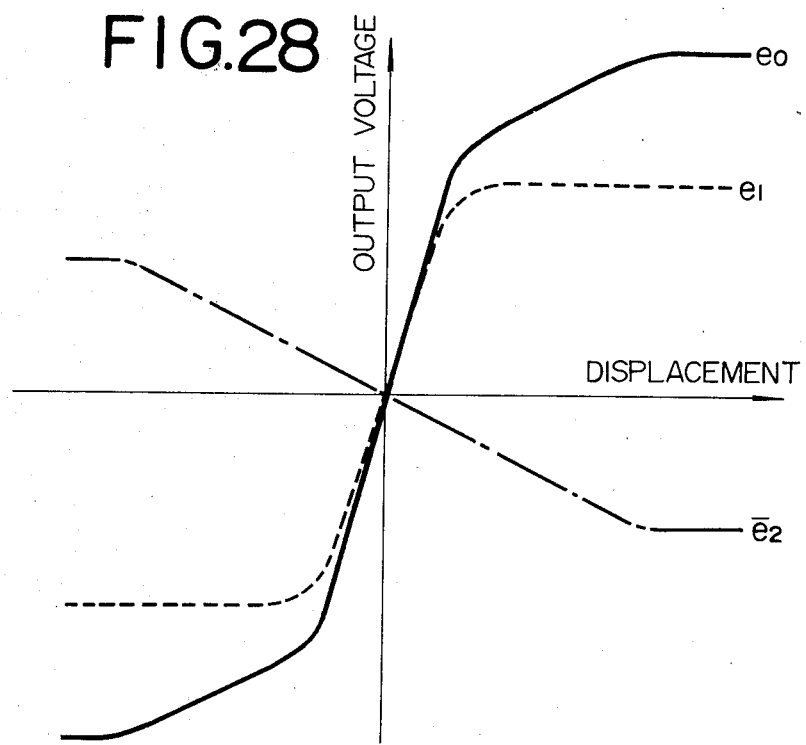
FIG. 28 is a graphical representation of characteristic curves which can be derived from a modification of the embodiment shown in FIG. 27.

In the embodiment of FIG. 25, amplifier $A_1$ is used as a unity gain inverting amplifier. It may be appreciated that amplifier $A_1$ may be omitted, and combining circuit 100 may thus be simplified, if output voltages $e_1$ and $e_2$ display opposite polarity with respect to each other. For example, if output voltage $\bar{e}_2$ may be inverted, such as inverted voltage $\bar{e}_2$, shown in FIG. 28, then amplifier $A_2$ need merely combine (or subtract) inverted voltage $e_2$ and voltage $e_1$. FIG. 28 illustrates the resultant $e_o = e_1 - \bar{e}_2$.

Figure 29:
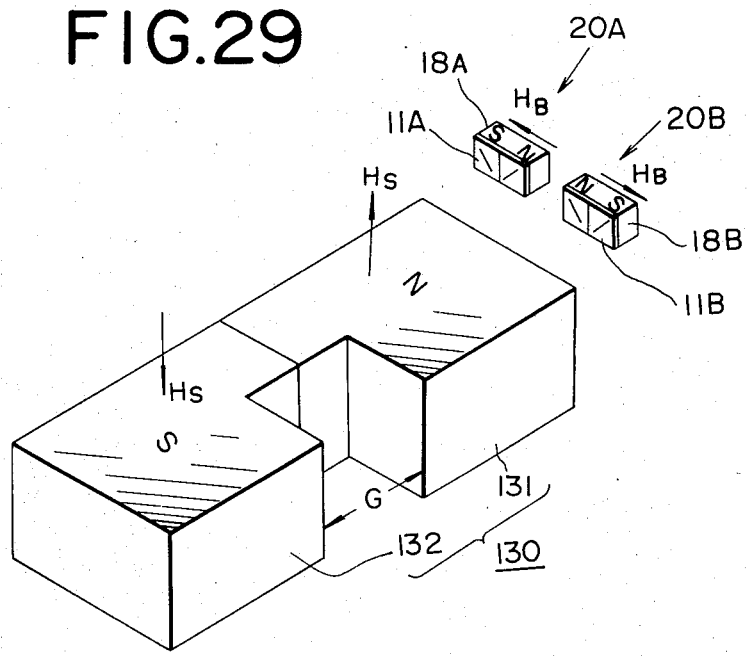

One technique which can be used to produce voltages $e_1$ and $e_2$ of opposite polarities is to supply bias fields $H_B$ of opposite polarities to magnetoresistive devices 11A and 11B, respectively. This technique is illustrated in FIG. 29, wherein magnetic sensor 20A is comprised of magnetoresistive device 11A coupled to bias magnet 18A; and magnetic sensor 20B is comprised of magnetoresistive device 11B coupled to bias magnet 18B. It is seen that the bias field $H_B$ produced by bias magnet 18A is of opposite polarity to the bias field $H_B$ produced by bias magnet 18B. As a consequence thereof, the output voltages derived from magnetic sensors 20A and 20B exhibit opposite polarities, as shown in FIG. 28.

Figure 30:
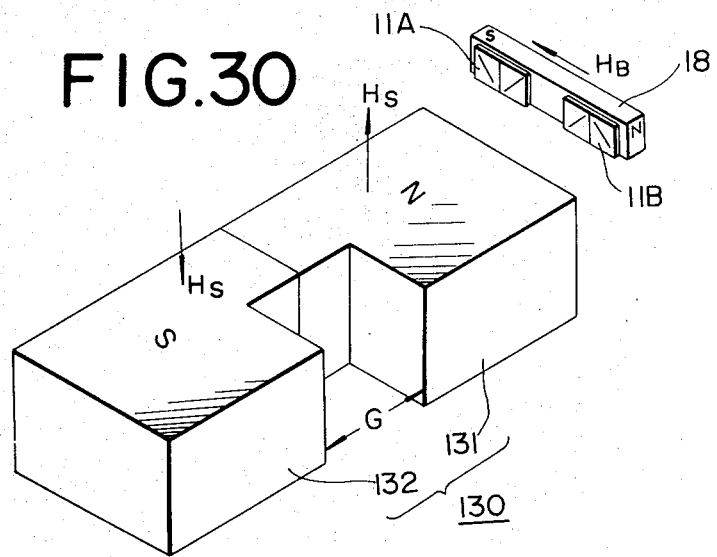
Figure 3I:
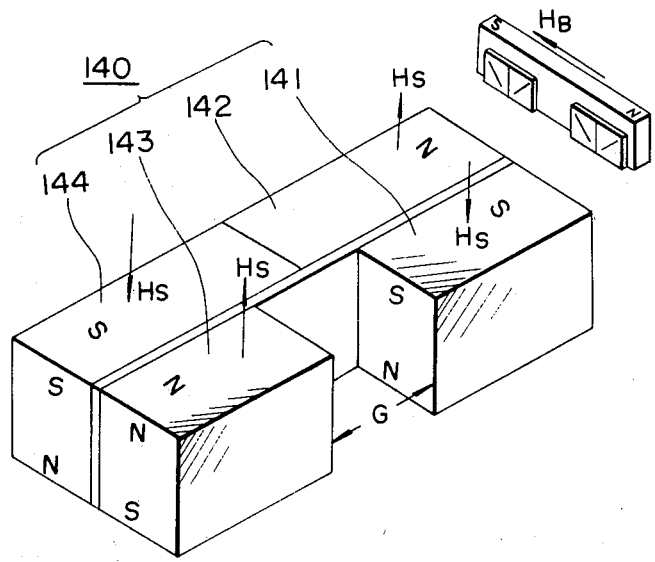
Figure 3I:
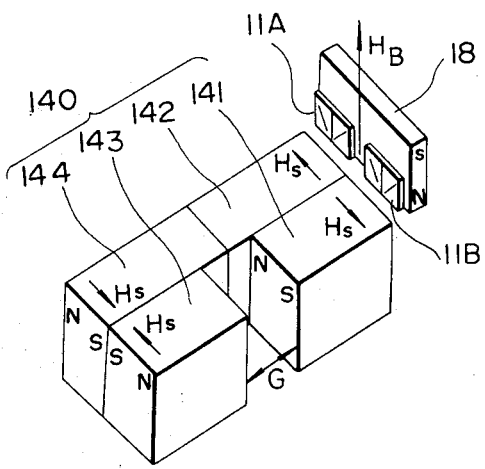

An alternative of the embodiment shown in FIG. 29 is illustrated in FIG. 30. In this alternative embodiment, although a single, common bias magnet 18 is provided, the current path directions of the magnetoresistive elements which constitute magnetoresistive device 11A are 180° out of phase with respect to the current path directions in the magnetoresistive elements which constitute magnetoresistive device 11B. This has the same effect as if the bias fields supplied to the respective magnetoresistive devices are of opposite polarities.

FIG. 13A illustrates yet another embodiment whereby magnetoresistive devices 11A and 11B produce output voltages $e_1$ and $\bar{e}_2$ of opposite polarity. In the embodiment of FIG. 31A, the magnetic sensors may be of the type discussed above with respect to FIG. 27. In the present embodiment, however, the signal fields $H_S$ supplied to the respective magnetic sensors are produced by magnetic field generator 140. This magnetic field generator is comprised of separate magnets 141–144. Magnets 141 and 143 are separated from each other by a gap G, and generate signal fields of opposite polarities. Magnets 142 and 144 are in abutting relationship to each other to define a boundary line. Magnets 142 and 144 generate signal fields of opposite polarities. Moreover, magnets 141 and 142 are aligned in side-by-side relationship and generate signal fields of opposite polarities. Likewise, magnets 143 and 144 are disposed in side-by-side relationship and generate signal fields of opposite polarities. Thus, as the magnetic sensors, which are in alignment with each other, are displaced along the length of the magnets which constitute signal field generator 140, it is appreciated that the signal field supplied to magnetic sensor 20A is of opposite polarity to the signal field supplied to magnetic sensor 20B. Signal field generator 140 thus is seen to differ from signal field generator 130 in that the polarities of the signal fields which are supplied to the respective magnetic sensors are opposite to each other. It is recalled that signal field generator 130 supplies signal fields to the respective magnetic sensors of equal polarities.

A modification of the embodiment shown in FIG. 31A is illustrated in FIG. 31B. In this modification, the bias field $H_B$ is supplied in the generally vertical direction; and the signal fields $H_S$ of opposite polarities are supplied in the generally horizontal direction. Nevertheless, in the FIG. 31B modification, the signal fields which are supplied to magnetoresistive devices 11A and 11B are of respectively opposite polarities. Whereas the signal field supplied to magnetoresistive device 11A undergoes a relatively abrupt transition, or change-over, at the illustrated boundary line, the signal field supplied to magnetoresistive device 11B undergoes a relatively gradual transition, or change-over, across gap G.

Figure 32:
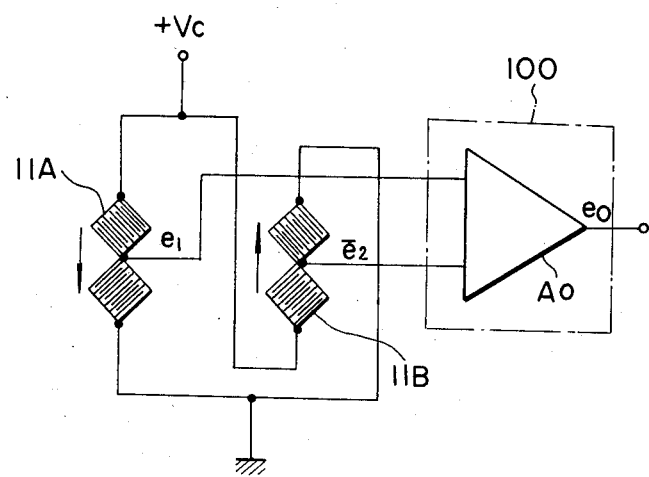
FIG. 32 is a schematic diagram of yet another embodiment by which the characteristic curves shown in FIG. 28 are obtained.

FIG. 32 illustrates yet another embodiment whereby output voltages $e_1$ and $\bar{e}_2$ of opposite polarities are produced. In this embodiment, bias currents are supplied to magnetoresistive devices 11A and 11B in respectively opposite polarities. For example, the bias current supplied through magnetoresistive device 11A may be referred to as a positive current, and the bias current supplied through magnetoresistive device 11B may be referred to as a negative current. The output voltages $e_1$ and $\overline{e}_2$ are supplied to combining circuit 100 which, in the illustrated embodiment, is comprised of a relatively simple difference amplifier $A_o$. The resultant output voltage $e_o$, produced by combining circuit 100, appears as shown in FIG. 28.

Figure 33:
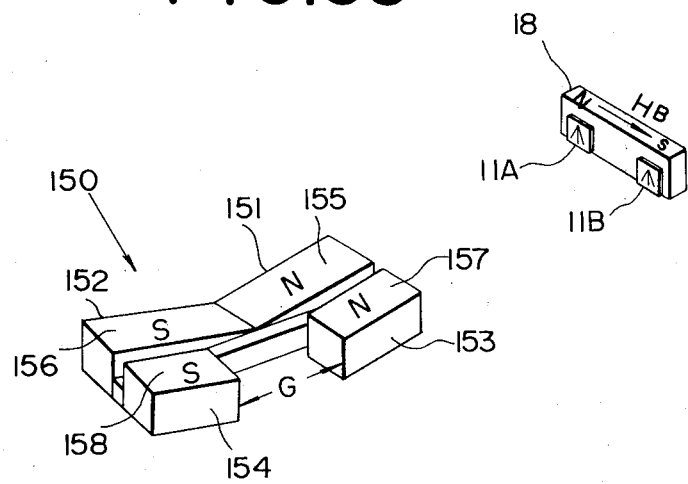
FIG. 33 is a schematic, perspective illustration of yet another modification of the present invention by which the characteristic curves of FIG. 28 are obtained.

Yet another embodiment of the arrangement shown in FIG. 27 is illustrated in FIG. 33. In this embodiment, magnetoresistive devices 11A and 11B are mounted on a common bias magnet 18. The respective signal fields supplied to these magnetoresistive devices are generated by signal field generator 150. This signal field generator is comprised of a pair of magnets 151 and 152, these magnets being aligned with the displacement path of magnetoresistive device 11A; and the signal field generator also is provided with another pair of magnets 153 and 154, this other pair being aligned with the displacement path of magnetoresistive device 11B. Magnets 151 and 152 are inclined with respect to each other, such as the embodiment shown in FIG. 20. Magnets 153 and 154 also are inclined with respect to each other and, moreover, are separated by a gap G, and are similar to the embodiment discussed above with respect to FIG. 21C. Preferably, top surface 155 of magnet 151 is coplanar with top surface 157 of magnet 153. Likewise, top surface 156 of magnet 152 is coplanar with top surface 158 of magnet 154. These coplanar surfaces are inclined such that the surface rise from the boundary line intersection thereof. Consequently, as magnetoresistive devices 11A and 11B are displaced across signal field generator 150, the clearance between the magnetoresistive devices and the surface of the signal field generator increases until the boundary line is reached, and then this clearance decreases.

When the embodiment shown in FIG. 33 is used, the output voltages $e_1$ and $e_2$ produced by magnetoresistive devices 11A and 11B may be supplied to the combining circuit shown in FIG. 25. If bias currents of opposite polarities are supplied to magnetoresistive devices 11A and 11B, the output voltages $e_1$ and $\overline{e}_2$ produced thereby may be supplied to the combining circuit shown in FIG. 32. As yet another modification, the signal fields produced by magnets 151 and 153 may be of opposite polarity to each other; and, likewise, the signal fields produced by magnets 152 and 154 may be oppositie polarities.

Figure 34:
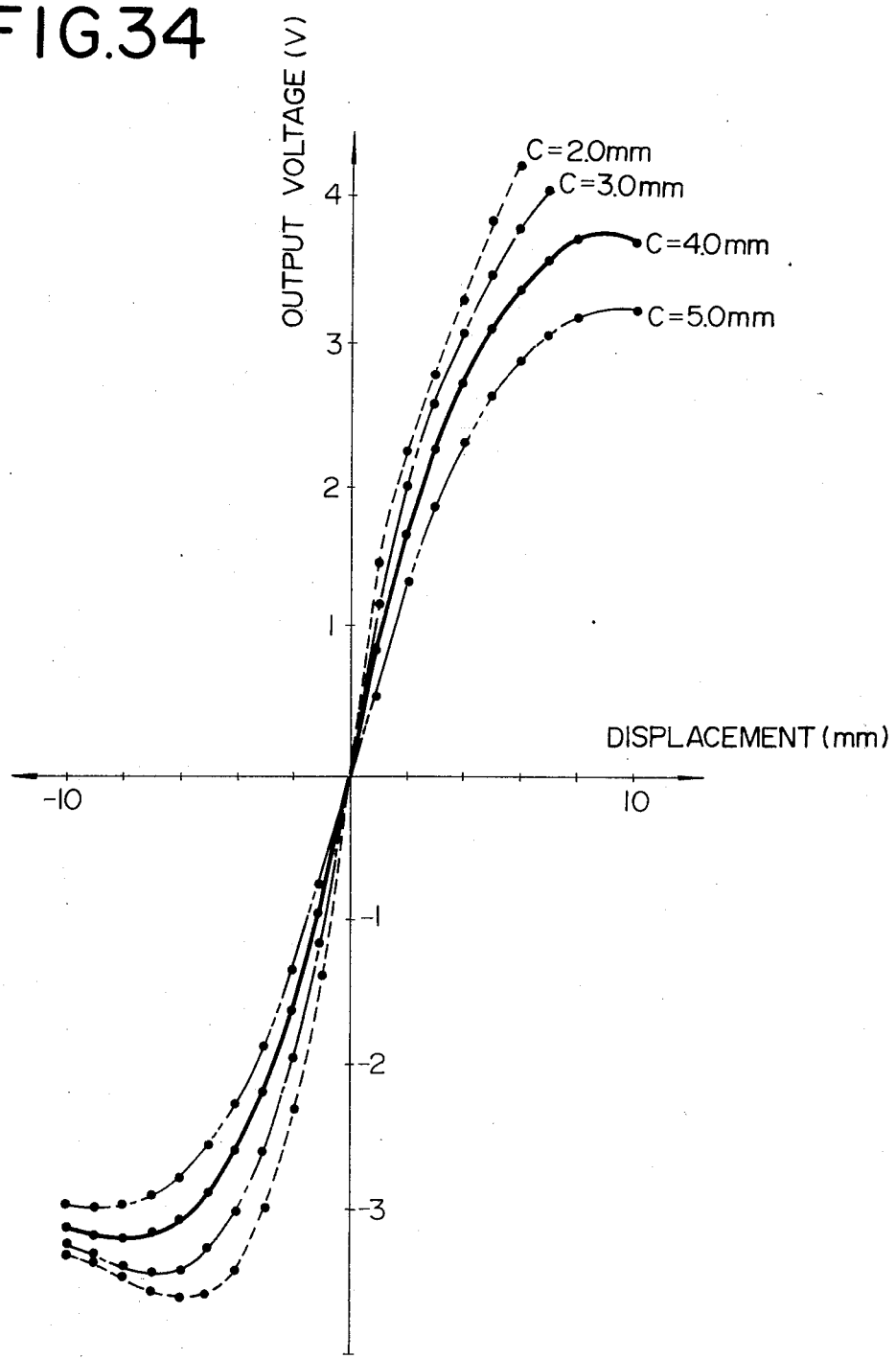
FIGS. 34 and 35 are graphical representations of characteristic curves which are obtained from the embodiment shown in FIG. 33.

The voltage-displacement relationship of the output voltage $e_o$ derived from the embodiment shown in FIG. 33 is illustrated in FIG. 34. The respective curves shown in FIG. 34 are obtained when different minimum clearances C are selected, such that C=2.0 mm, C=3.0 mm, C=4.0 mm and C=5.0 mm. Furthermore, in the embodiment shown in FIG. 33, from which the curves of FIG. 34 are obtained, the magnets are barium-ferrite magnets, and magnets 151 and 152 each is 5 mm wide, 14 mm long and 5 mm thick, or high. Magnets 153 and 154 likewise are barium-ferrite magnets each of whose width is 5 mm, its height is 5 mm and its length is 9 mm. Magnets 153 and 154 are separated from each other by the gap G of 8.5 mm. Furthermore, the inclination of the illustrated magnets is such that the boundary line lies 2 mm below the plane in which the opposite, or free, edges of the inclined magnets lie.

Figure 35:
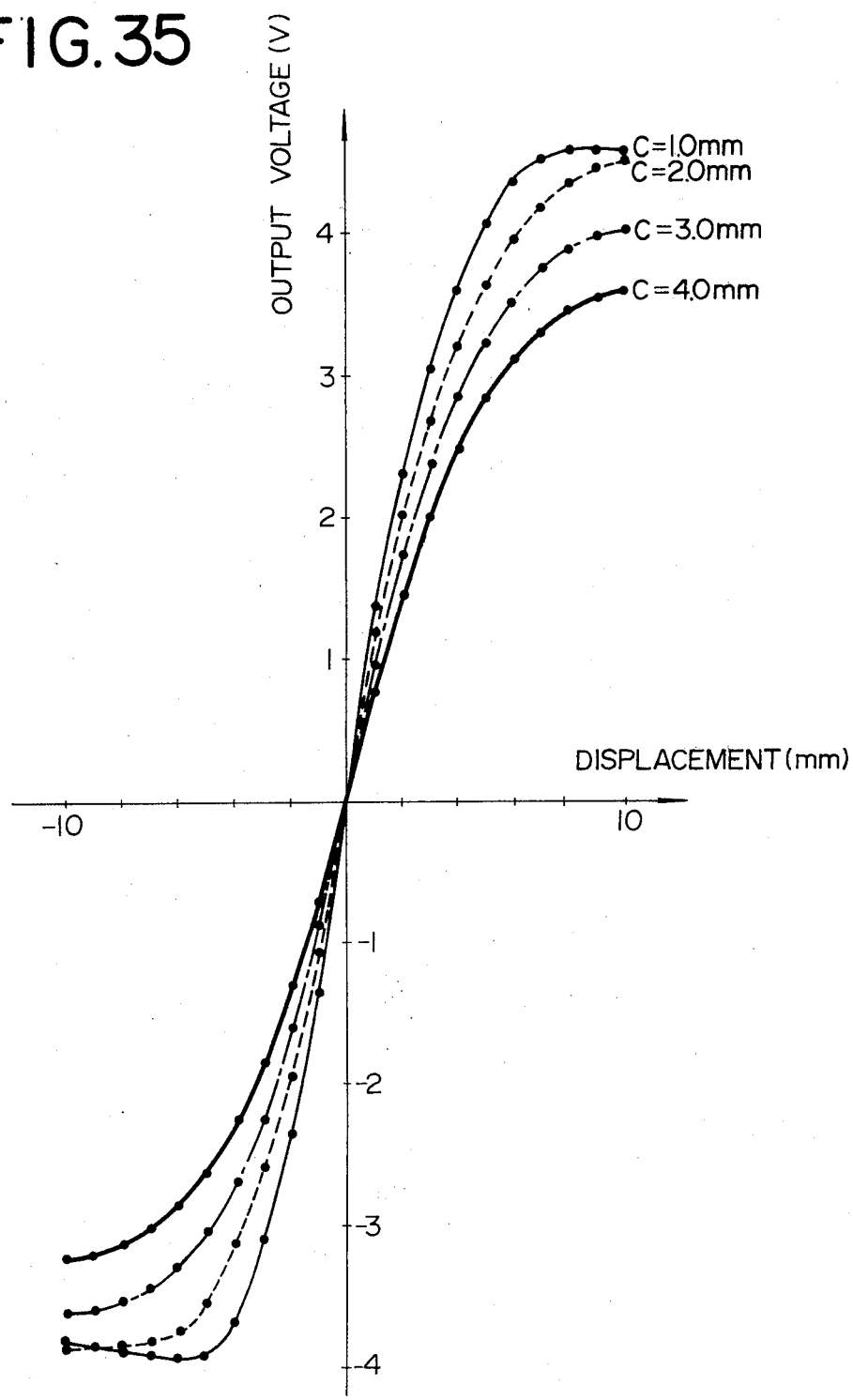

If magnets 151-154 do not exhibit the inclined relationship shown in FIG. 33, the resultant voltage-displacement relationship for different clearances C appears as shown by the curves of FIG. 35.

A comparison of the curves shown in FIGS. 34 and 35 indicates that improved detection is obtained from the embodiment of FIG. 33 when magnets 151,152 and magnets 153,154 exhibit the illustrated inclined relationship. That is, the output voltage $e_o$ varies uniformly over a relatively wide range of displacement.

Figure 36:
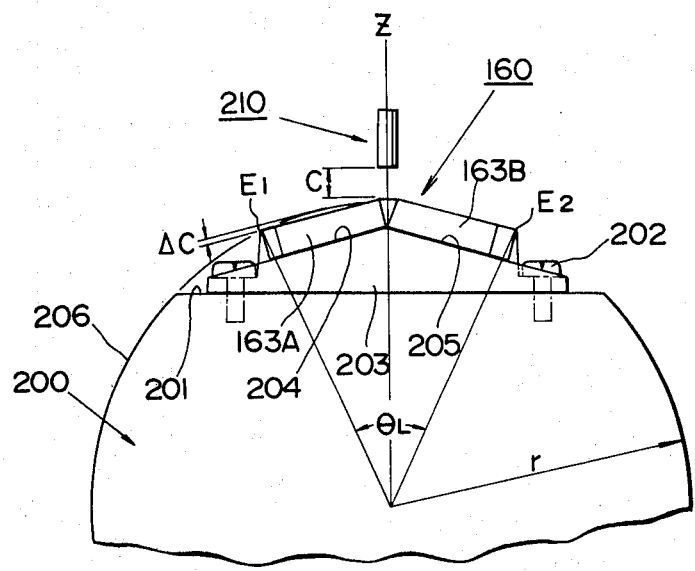
FIG. 36 is a sectional view of a practical application of the embodiments shown in, for example, FIG. 27 or 29.

FIG. 36 illustrates a practical embodiment of the present invention when used to detect the rotary position of a rotary member 200. As an example, rotary member 200 may comprise a spindle, a rotary shaft, a motor shaft, or the like. In this embodiment, shown also in the perspective view of FIG. 37, a magnetic sensor 210 is fixedly disposed and is provided with respective magnetoresistive devices 11A, 11B and 11C. Magnetic sensor 210 is adpated to detect signal fields supplied thereto by a signal field generator 160. This signal field generator is comprised of source magnets 161A and 161B, associated with magnetoresistive device 11A; source magnets 162A and 162B, associated with magnetoresistive device 11B; and source magnets 163A and 163B, associated with magnetoresistive device 11C. These source magnets, which may be of the type shown in, for example, FIG. 33, but having an opposite inclination, that is, the surfaces of these magnets slope downwardly from the apex, are mounted on inclined surfaces 204,205 of a support bed 203. Bed 203 is fixedly secured to a mounting surface 201 of rotary member 200 by means of, for example, screws 202. A nonmagnetic protective cover may be disposed over the respective magnets. For ease of manufacture, it is preferable, but not necessary, that the respective magnets exhibit a parallel-piped shape.

As shown in FIG. 36, the opposite edges $E_1$ and $E_2$ of bed 203 define an arc of angle $\theta_L$. Edges $E_1$ and $E_2$ intersect the peripheral surface 206 of rotary member 200. The apex of the surfaces defined by the respective magnets, that is, the apex defined by the surface of magnets 161A, 162A and 163A which intersects with the surface defined by magnets 161B, 162B and 163B also is disposed at the peripheral surface of rotary member 200. Thus, the respective surfaces of these magnets are seen to define chords, as shown more particularly in FIG. 36. The center portion of each of these chords is disposed beneath the peripheral plane of rotary member 200 by the amount $\Delta C$. Thus, from FIG. 36, it is seen that edges $E_1$ and $E_2$, and also the apex defind by the intersecting planes in which the surfaces of the respective magnets lie, are disposed at the radial distance r from the axis of rotation of rotary member 200.

As the rotary member rotates past fixedly disposed magnet sensor 210, it is appreciated that the clearance C between the magnetic sensor and the surfaces of magnets 161A, 161B, 162A, 162B, 163A and 163B increases by the amount $\Delta C$ when, for example, the rotary member rotates in the counterclockwise direction such that edge $E_1$ passes beneath the magnetic sensor, until the mid-point of the chord defined by the plane of the surfaces of magnets 161A, 162A and 163A is juxtaposed beneath the magnetic sensor. Then, as rotary member 200 continues to rotate in the counterclockwise direction, this clearance $(C+\Delta C)$ decreases until the apex defined by the intersection of the planes of the surfaces of the respective magnets is juxtaposed magnetic sensor 210. Thereafter, as the rotary member continues to rotate in the counterclockwise direction, this clearance increases by the amount ΔC when the mid-point of the chord defined by the plane of the surface of magnets 161B, 162B and 163B rotates beneath the magnetic sensor. This clearance once again reduces to C when rotary member 200 rotates so as to bring edge $E_2$ beneath the magnetic sensor. Hence, during the angular rotation $\theta_L$, the clearance between magnetic sensor 210 and signal field generator 160 changes by the amount ΔC. The effect of this change in clearance during relative displacement of the magnetic sensor and the signal field generator has been discussed hereinabove with respect to the embodiments shown in FIGS. 20, 21 and 33.

Figure 38:
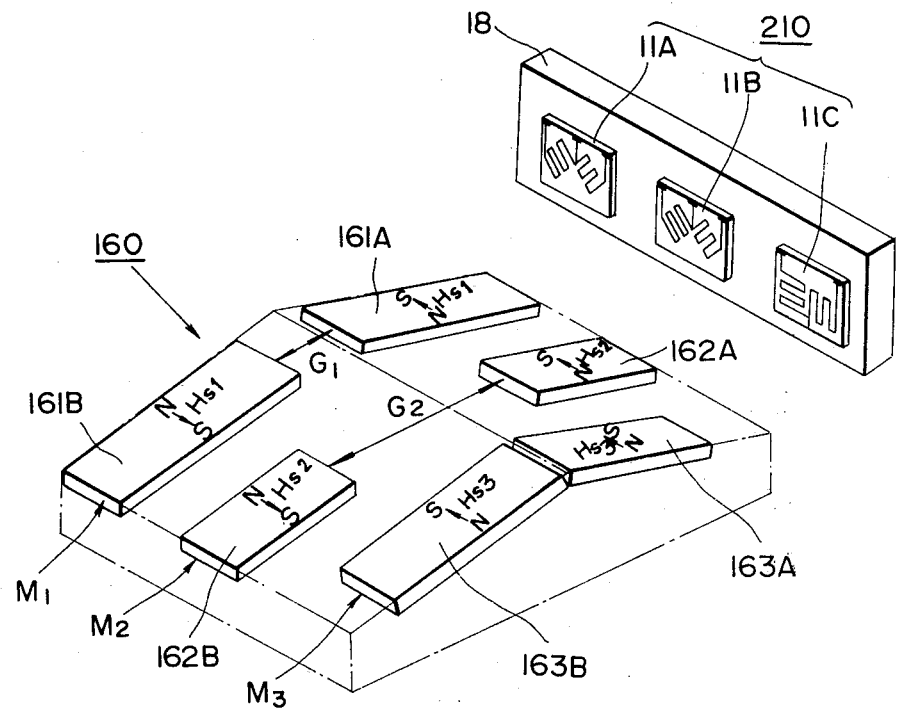
FIG. 38 is a perspective illustration of an enlargement of a portion of the embodiment shown in FIG. 37.

FIG. 38 shows, in greater detail, the relationship between magnetic sensor 210 and signal field generator 160. It is seen that the current paths of magnetoresistive devices 11A and 11B are disposed at 45° with respect to the bias field $H_B$. However, the magnetoresistive elements which constitute magnetoresistive device 11C are provided with current paths that are, respectively, parallel and perpendicular to the direction of the bias fields $H_B$.

Signal field generator 160 is illustrated as comprising three sets of magnets $M_1$, $M_2$ and $M_3$, these three sets of magnets being aligned with magnetoresistive devices 11A, 11B and 11C, respectively, such that, when rotary member 200 rotates, these magnets are rotatably displaced beneath their respective magnetoresistive devices. Magnets $M_1$ generate signal field $H_{S1}$ of opposite polarities. That is, the polarity of this signal field changes over in the general vicinity of the illustrated apex. More particularly, magnets 161A and 161B, which constitute the set of magnets $M_1$, are separated from each other by a gap $G_1$.

Similarly, the set of magnets $M_2$ generates signal field $H_{S2}$ of opposite polarities. That is, the polarity of the signal field generated by magnets $M_2$ changes over in the general vicinity of the illustrated apex. Magnets 162A and 162B, which constitute the set of magnets $M_2$, are separated from each other by a gap $G_2$. As illustrated, $G_1 < G_2$.

Magnets $M_3$ generate the signal field $H_{S3}$ which is of constant polarity on either side of the illustrated apex. Moreover, magnets 163A and 163B, which constitute the set of magnets $M_3$, are seen to abut at the apex.

The opposite, or leading and trailing edges of magnets 161A and 161B, respectively, are seen to be aligned with the corresponding opposite, leading and trailing edges of magnets 162A and 162B, respectively. Accordingly, as signal field generator 160 is displaced past magnetic sensor 210, magnetoresistive devices 11A and 11B detect signal fields $H_{S1}$ and $H_{S2}$, respectively, whose polarities change over as the apex of the illustrated signal generator is displaced past magnetic sensor 210. Since gap $G_2$ is greater than $G_1$, it is appreciated that this change-over in the polarity of signal field $H_{S2}$ is more gradual, that is, occurs at a relatively slower rate, than the polarity change-over of signal field $H_{S1}$. However, signal field $H_{S3}$ supplied to magnetoresistive device 11C does not undergo any polarity change-over. The output voltage thus produced by magnetoresistive device 11C indicates that signal field generator 160 has been displaced to within a predetermined amount of, for example, a reference position; and this output voltage can be used as a gating signal for the servo control system (not shown).

Figure 39:
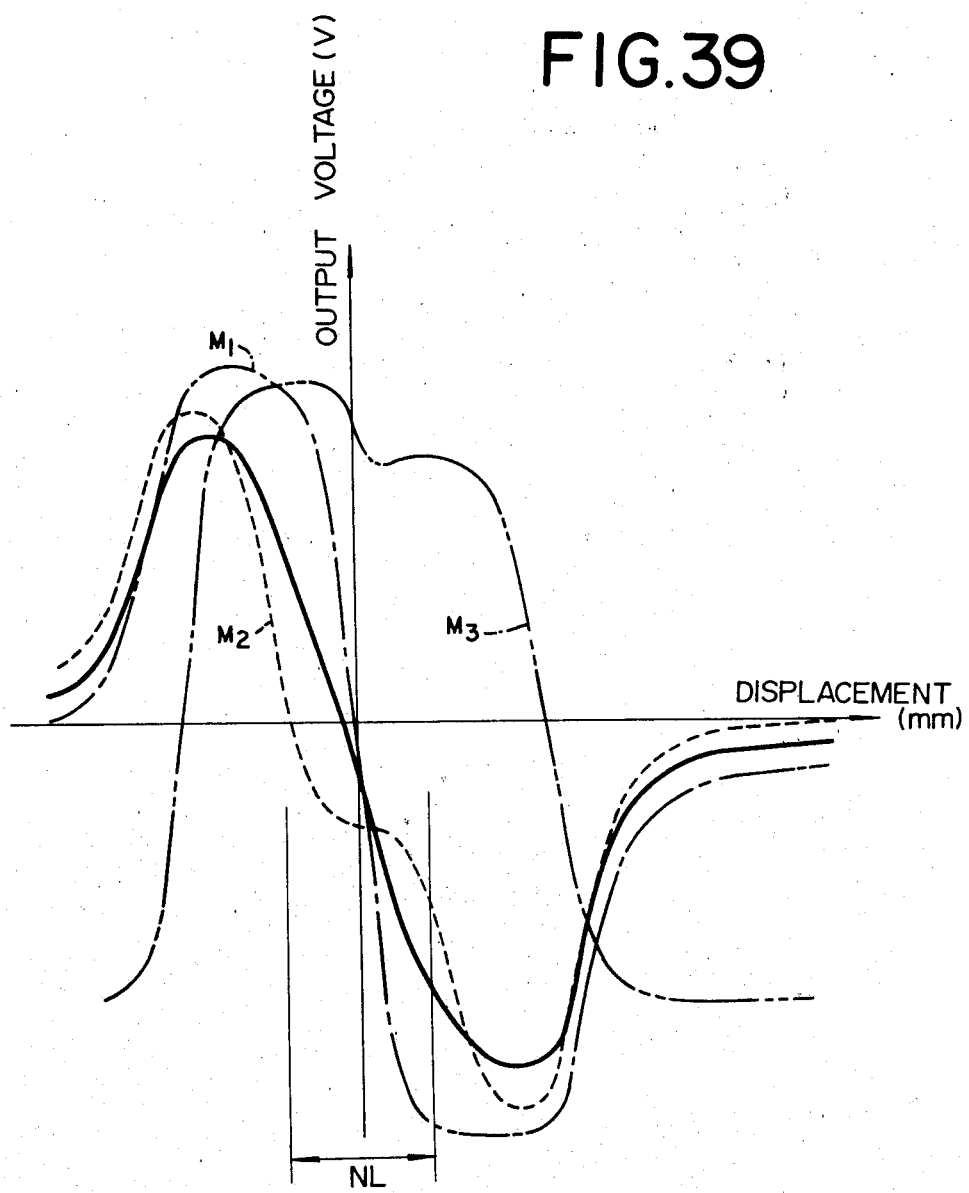
FIG. 39 is a graphical representation of the characteristic curves which are obtained from the arrangement shown in FIG. 38.

If the gap, such as gap $G_2$, separating the magnets of a particular set is too large, the linearity of the output voltage produced by the corresponding magnetoresistive device, such as device 11B, in response to displacement may be deleteriously affected. For example, and as shown in FIG. 39, the voltage curve $M_2$, produced by magnetoresistive device 11B in response to the signal field generated by magnets $M_2$, exhibits the non-linear region NL. But, it is seen that the voltage curve $M_1$ produced by magnetoresistive device 11A in response to the signal field generated by magnets $M_1$ does not exhibit a similar non-linear region. Consequently, when the voltages $M_1$ and $M_2$ are combined, as by supplying these voltages to combining circuit 100 (shown in FIG. 25 or in FIG. 32), the resultant output voltage is linear over a relatively wide range of displacement and, moreover, exhibits a wide detecting range, as shown by the solid curve of FIG. 39.

Voltage curve $M_3$ is produced by magnetoresistive device 11C in response to the signal field $H_{S3}$ generated by magnets $M_3$. Since signal field $H_{S3}$ does not undergo a polarity change-over, voltage curve $M_3$ does not exhibit similar positive and negative characteristics. Nevertheless, this voltage curve $M_3$ may be used as a gating signal to indicate that signal field generator 160 has rotated to within a predetermined angular range of magnetic sensor 210, thereby activating a suitable position or displacement control system (not shown).

Figure 37:
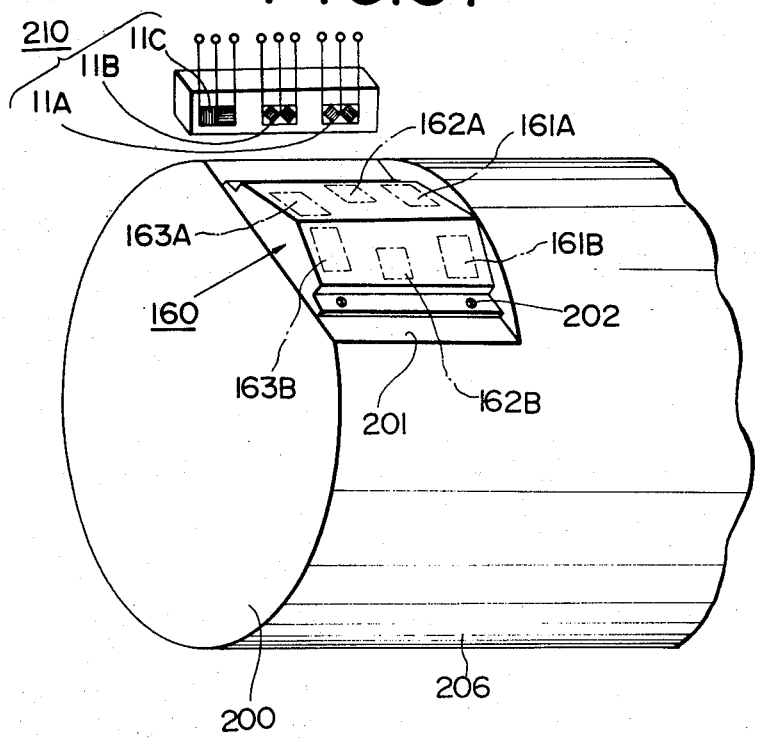
FIG. 37 is a perspective illustration of the arrangement shown in section in FIG. 36.

In the embodiment shown in FIGS. 36–38, the sets of magnets $M_1$, $M_2$ and $M_3$ may, if desired, be formed of flexible rubber magnetizing material having arcuate shapes. This will reduce or obviate the change of clearance ΔC, discussed above with respect to FIG. 36. Also, although signal fields $H_{S1}$ and $H_{S2}$ are seen to be of the same polarities on opposite sides of the apex illustrated in FIG. 38, such signal fields may, if desired, exhibit opposite polarities, such as shown in FIG. 31B. Furthermore, while the signal fields are shown in FIG. 38 to be in the generally horizontal direction, and the bias field $H_B$ is in the generally vertical direction, the signal fields may, if desired, be supplied in the generally vertical direction and the bias field may be supplied in the generally horizontal direction, such as shown in, for example, FIGS. 27, 29, 30, 31A and 33.

While the present invention has been particularly shown and described with reference to certain preferred embodiments thereof, it will be readily appreciated by those of ordinary skill in the art that various changes and modifications in form and details may be made without departing from the spirit and scope of the invention. It is, therefore, intended that the appended claims be interpreted as including all such changes and modifications.

What is claimed is:

1. In magnetic field sensing apparatus comprising:
magnetic sensing means including first and second magnetoresistive elements having respective, substantially planar, current path portions disposed at a predetermined angle with respect to each other and through which current flows in correspondingly respective current flow directions, means for supplying a bias current to flow through said respective current path portions, and bias field means for supplying a bias magnetic field in the plane of said respective current path portions; and
external field generating means for supplying a magnetic signal field in said plane of said respective current path portions, said external field generating means and said magnetic sensing means being relatively displaceable with respect to each other;

the improvement wherein said bias magnetic field is supplied at an angle of approximately 45° with respect to each of said current flow directions, and wherein said external field generating means comprises magnetizing means for generating said magnetic signal field of a first polarity that gradually decreases and changes over at a boundary region to an opposite polarity that gradually increases, all in the direction of relative displacement, said gradually changing magnetic signal field being detected by said magnetic sensing means to produce an output signal that varies substantially linearly with said displacement over a predetermined range of displacement on both sides of said boundary region.

2. The improvement of claim 1 wherein said magnetizing means comprises first and second magnetic means for generating magnetic signal fields of opposite polarities, said first and second magnetic means being separated by a gap of substantially non-magnetic material.

3. The improvement of claim 2 wherein each of said magnetic signal fields extends in a direction perpendicular to the direction of said bias magnetic field, and said gap extends in a direction perpendicular to said direction of relative displacement.

4. The improvement of claim 2 wherein said gap is substantially centered on said boundary region.

5. The improvement of claim 1 wherein said magnetizing means comprises first and second magnet means for generating magnetic signal fields of opposite polarities, said first and second magnet means being separated from each other in the direction of displacement and each being of a predetermined width; and third and fourth magnet means for generating magnetic signal fields of opposite polarities, said third and fourth magnet means being disposed in the separation between said first and second magnet means and each being of a width less than the predetermined width of said first and second magnet means.

6. The improvement of claim 5 wherein each of said magnetic signal fields extends in a direction perpendicular to the direction of said bias magnetic field.

7. The improvement of claim 6 wherein the magnetic signal fields generated by said first and third magnet means are of the same polarity, and the magnetic signal fields generated by said second and fourth magnet means are of the same polarity.

8. The improvement of claim 7 wherein said third and fourth magnet means are substantially centered on said boundary region.

9. The improvement of claim 1 wherein said magnetizing means comprises first and second magnet means for generating magnetic signal fields of opposite polarities and disposed in facing relationship to each other to define a longitudinal boundary region that extends in a direction at a predetermined angle to said direction of displacement, said predetermined angle being less than 90°.

10. The improvement of claim 9 wherein said magnetizing means further comprises third and fourth magnet means for generating magnetic signal fields of opposite polarities, said third and fourth magnet means being separated from each other by said first and second magnet means and also being at opposite ends of said longitudinal boundary.

11. The improvement of claim 10 wherein each of said magnet means is arcuate-shaped to define a cylindrical surface, the combination of said first and second magnet means being offset with respect to said third and fourth magnet means and said third and fourth magnet means being offset with respect to each other.

12. The improvement of claim 1 wherein said magnetizing means comprises first and second magnet means for generating magnetic signal fields of opposite polarities and having surfaces which lie in first and second intersecting planes such that said surfaces are angularly disposed with respect to each other.

13. The improvement of claim 12 wherein said first and second magnet means about each other in said boundary region to define a boundary line.

14. The improvement of claim 13 wherein said boundary line is substantially perpendicular to the direction of displacement; and wherein the surfaces of said first and second magnet means slope upwardly from said boundary line.

15. The improvement of claim 12 wherein said first and second magnet means are separated from each other by a gap that is substantially centered on said boundary region.

16. The improvement of claim 15 wherein the surfaces of said first and second magnet means slope upwardly from said gap.

17. The improvement of claim 1 wherein said first and second magnetoresistive elements are included in a first sensor and said magnetic sensing means further includes a second sensor formed of third and fourth magnetoresistive elements having respective, substantially planar current path portions disposed at a predetermined angle with respect to each other through which current flows and means for supplying a bias magnetic field to said second sensor; and wherein said external field generating means further comprises means for supplying to said second sensor a magnetic signal field which changes abruptly from said first polarity to said opposite polarity at said boundary region; and further comprising means for deriving an output signal from said second senor as a function of the displacement thereof with respect to said means for supplying a magnetic signal field; and means for combining both output signals from said first and second sensors to produce a composite signal representing the relative displacement of said sensors from said external field generating means.

18. The improvement of claim 17 further comprising means for supporting said first and second sensors in alignment with each other.

19. The improvement of claim 18 wherein said first and second sensors are coplanar and are disposed in side-by-side relationship; and said external field generating means comprises first and second magnet means for generating magnetic signal fields of opposite polarities, said first and second magnet means abutting each other to define a boundary line perpendicular to the direction of relative displacement of said second sensor and said first and second magnet means being separated from each other to define a gap in said boundary region, said gap being traversed by the relative displacement of said first sensor.

20. The improvement of claim 19 wherein said means for combining comprises inverting means for inverting said output signal from said second sensor; and summing means for summing the output signal from said first sensor with the inverted output signal.

21. The improvement of claim 19 wherein said means for supporting said first and second sensors comprises a bias magnet for generating said bias magnetic fields and to which said first and second sensors are secured.

22. The improvement of claim 19 wherein said bias magnetic fields supplied to said first and second sensors are of opposite polarities such that the output signals from said first and second sensors are of opposite polarities.

23. The improvement of claim 19 wherein the current flow directions through said first and second magnetoresistive elements are at 90° with the current flow directions through said third and fourth magnetoresistive elements, respectively, such that the output signals from said first and second sensors are of opposite polarities.

24. The improvement of claim 18 wherein said external field generating means comprises first and second magnet means for generating magnetic signal fields of opposite polarities, said first and second magnet means being separated by a gap which is substantially perpendicular to the direction of relative displacement of said first sensor; and third and fourth magnet means for generating magnetic signal fields of opposite polarities, said third and fourth magnet means abutting each other to define a boundary line perpendicular to the direction of relative displacement of said second sensor, the magnetic signal fields generated by said first and second magnet means being opposite to the magnetic signal fields generated by said third and fourth magnet means, respectively.

25. The improvement of claim 24 wherein said first and third magnet means have surfaces which lie in a first plane and said second and fourth magnet means have surfaces which lie in a second plane that intersects with said first plane such that said surfaces slope upwardly from said intersection.

26. The improvement of claim 18 wherein said external field generating means is mounted on a rotary member, said external field generating means comprising first and second magnetic strips for generating magnetic signal fields of opposite polarities, said first and second magnetic strips being separated by a gap which is substantially perpendicular to the direction of relative displacement of said first sensor; and third and fourth magnetic strips for generating magnetic signal fields of opposite polarities, said third and fourth magnetic strips being separated by a gap which is substantially perpendicular to the direction of relative displacement of said second sensor, the gap between said first and second magnetic strips being wider than the gap between said third and fourth magnetic strips, the leading edges of said first and third magnetic strips being aligned with each other and the trailing edges of said second and fourth magnetic strips being aligned with each other.

27. The improvement of claim 1 wherein said first and second magnetoresistive elements comprise first and second strips of ferromagnetic metal film, each strip being arranged in serpentine configuration and having a main current path portion, the main current path portions of said first and second strips being perpendicular to each other and being connected in series to define a junction from which said output signal is produced.

28. The improvement of claim 27 wherein said ferromagnetic metal film is selected from the group consisting of NiCo, NiFe, NiAl, NiMn and NiZn alloys.

29. Magnetic field sensing apparatus comprising:
magnetic sensing means including a first sensor comprised of first and second magnetoresistive elements having respective, substantially planar, current path portions disposed at a predetermined angle with respect to each other and through which current flows in correspondingly respective current flow directions, a second sensor comprised of third and fourth magnetoresistive elements having respective, substantially planar current path portions disposed at said predetermined angle with respect to each other through which current flows in correspondingly respective current flow directions, means for supplying bias currents to flow through said respective current path portions of said magnetoresistive elements, and bias field means for supplying bias magnetic fields in the planes of said respective current path portions of said magnetoresistive elements;
external field generating means for supplying to said first sensor a first magnetic signal field in said plane of said respective current path portions of said first and second magnetoresistive elements and for supplying to said second sensor a second magnetic signal field in said plane of respective current path portions of said third and fourth magnetoresistive elements, said external field generating means and said magnetic sensing means being relatively displaceable with respect to each other; and said first magnetic signal field having a first polarity that gradually decreases and changes over at a boundary region to an opposite polarity that gradually increases, all in the direction of relative displacement, and said second magnetic signal field having a polarity which changes abruptly at said boundary region, said gradually changing first magnetic signal field being detected by said first sensor to produce a first output signal that varies substantially linearly with said displacement over a predetermined range of displacement on both sides of said boundary region and said second magnetic signal field being detected by said second sensor to produce a second output signal as a function of the relative displacement of said magnetic sensing means with respect to said external field generating means; and
means for combining said first and second output signals from said first and second sensors to produce a composite signal representing the relative displacement of said sensors with respect to said external field generating means.

30. The apparatus of claim 29 further comprising means for supporting said first and second sensors in alignment with each other.

31. The apparatus of claim 30 wherein said first and second sensors are coplanar and are disposed in side-by-side relationship; and said external field generating means comprises first and second magnet means for generating said first and second magnetic signal fields, said first and second magnet means abutting each other to define a boundary line perpendicular to the direction of relative displacement of said second sensor, and said first and second magnet means being separated from each other to define a gap which is traversed by the relative displacement of said first sensor.

32. The apparatus of claim 29 wherein said first and second magnetic signal fields are of equal polarities; and wherein said means for combining comprises inverting means for inverting said second output signal from said second sensor; and summing means for summing the first output signal from said first sensor with the inverted second output signal.

33. The apparatus of claim 29 wherein said means for supporting said first and second sensors comprises a bias magnet for generating said bias magnetic fields and to which said first and second sensors are secured.

34. The apparatus of claim 29 wherein said first and second magnetic signal fields are of equal polarities; and wherein said bias magnetic fields supplied to said first and second sensors are of opposite polarities such that the first and second output signals from said first and second sensors are of opposite polarities.

35. The apparatus of claim 29 wherein the first and second magnetic signal fields are of equal polarities; and wherein the current flow directions through said first and second magnetoresistive elements are at 90° with the current flow directions through said third and fourth magnetoresistive elements, respectively, such that the output signals from said first and second sensors are of opposite polarities.

36. The apparatus of claim 29 wherein said external field generating means comprises first and second magnet means for generating said first magnetic signal field, said first and second magnet means being separated by a gap which is substantially perpendicular to the direction of relative displacement of said first sensor; and third and fourth magnet means for generating said second magnetic signal field, said third and fourth magnet means abutting each other to define a boundary line perpendicular to the direction of relative displacement of said second sensor, said first magnetic signal field being opposite in polarity to said second magnetic signal field.

37. The apparatus of claim 36 wherein said first and third magnet means have surfaces which lie in a first plane and said second and fourth magnet means have surfaces which lie in a second plane that intersects with said first plane such that said surfaces slope upwardly from said intersection.

38. The apparatus of claim 29 wherein said external field generating means is mounted on a rotary member, said external field generating means comprising first and second magnets for generaring said first magnetic signal field, said first and second magnets being separated by a gap which is substantially perpendicular to the direction of relative displacement of said first sensor; and third and fourth magnets for generating said second magnetic signal field, said third and fourth magnets being separated by a gap which is substantially perpendicular to the direction of relative displacement of said second sensor, the gap between said first and second magnets being wider than the gap between said third and fourth magnets, the leading edges of said first and third magnets being aligned with each other and the trailing edges of said second and fourth magnets being aligned with each other.

39. The apparatus of claim 29 wherein said first and second magnetic signal fields are of equal polarities; and wherein current flows through said first sensor in a direction opposite to that in which the current flows through said second sensor.

* * * * *